(12) United States Patent
Yoshioka et al.

(10) Patent No.: US 11,177,780 B2
(45) Date of Patent: Nov. 16, 2021

(54) FRONT-END CIRCUIT AND COMMUNICATION DEVICE

(71) Applicant: MURATA MANUFACTURING CO., LTD., Kyoto (JP)

(72) Inventors: Junichi Yoshioka, Nagaokakyo (JP); Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/831,107

(22) Filed: Mar. 26, 2020

(65) Prior Publication Data

US 2020/0313632 A1    Oct. 1, 2020

(30) Foreign Application Priority Data

Mar. 28, 2019    (JP) .............................. JP2019-063367

(51) Int. Cl.
*H03F 3/19*    (2006.01)
*H03F 1/08*    (2006.01)

(52) U.S. Cl.
CPC ............... *H03F 3/19* (2013.01); *H03F 1/086* (2013.01); *H03F 2200/294* (2013.01); *H03F 2200/451* (2013.01)

(58) Field of Classification Search
CPC ...... H03F 3/19; H03F 1/086; H03F 2200/294; H03F 2200/451
USPC .......................................... 455/73–83, 552.1
See application file for complete search history.

(56) References Cited

U.S. PATENT DOCUMENTS

| | | | |
|---|---|---|---|
| 2014/0003300 A1* | 1/2014 | Weissman | H04B 1/0064 370/273 |
| 2016/0127015 A1 | 5/2016 | Wloczysiak et al. | |
| 2016/0322997 A1* | 11/2016 | Wloczysiak | H03F 3/245 |
| 2017/0222694 A1 | 8/2017 | Tota | |

FOREIGN PATENT DOCUMENTS

| | | |
|---|---|---|
| CN | 104412513 A | 3/2015 |
| JP | 2017-135610 A | 8/2017 |

* cited by examiner

*Primary Examiner* — Lee Nguyen
(74) *Attorney, Agent, or Firm* — Pearne & Gordon LLP

(57) ABSTRACT

A front-end circuit includes: a filter that converts an unbalanced radio frequency signal inputted to an input terminal into two balanced radio frequency signals, and outputs one of the two balanced radio frequency signals from an output terminal and the other of the two balanced radio frequency signals from another output terminal; a low-noise amplifier connected to the output terminal; and a low-noise amplifier connected to the other output terminal.

14 Claims, 17 Drawing Sheets

FRONT-END CIRCUIT AND COMMUNICATION DEVICE

CROSS REFERENCE TO RELATED APPLICATION

The present application is based on and claims priority of Japanese Patent Application No. 2019-063367 filed on Mar. 28, 2019. The entire disclosure of the above-identified application, including the specification, drawings and claims is incorporated herein by reference in its entirety.

FIELD

The present disclosure relates to a front-end circuit, and a communication device including the front-end circuit.

BACKGROUND

There has been a demand that a front-end circuit that is multiband and multimode compatible simultaneously transfer radio frequency signals with low loss.

Patent Literature (PTL) 1 (U.S. Unexamined Patent Application Publication No. 2016/0127015) discloses a receiver module having a configuration in which filters having different passbands are connected to an antenna via a multiplexer (switch).

SUMMARY

Technical Problem

In the receiver module (front-end circuit) disclosed in PTL 1, however, in order to simultaneously transfer radio frequency signals in communication bands, a filter is disposed for each path for transferring a radio frequency signal in one communication band. For this reason, as many filters as communication bands for transfer are necessary, and the receiver module (front-end circuit) grows in size as communication bands increase.

In view of this, the present disclosure has been made to solve the above problem, and is intended to provide a small front-end circuit and a small communication device that simultaneously transfer radio frequency signals.

Solution to Problem

A front-end circuit according to one aspect of the present disclosure is a front-end circuit that includes: a first filter that includes a first input terminal, a first output terminal, and a second output terminal, converts a radio frequency unbalanced signal inputted to the first input terminal into two radio frequency balanced signals, and outputs one of the two radio frequency balanced signals from the first output terminal, and the other of the two radio frequency balanced signals from the second output terminal; a first low-noise amplifier that is connected to the first output terminal; and a second low-noise amplifier that is connected to the second output terminal.

Advantageous Effects

The present disclosure provides a small front-end circuit and a small communication device that simultaneously transfers radio frequency signals.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
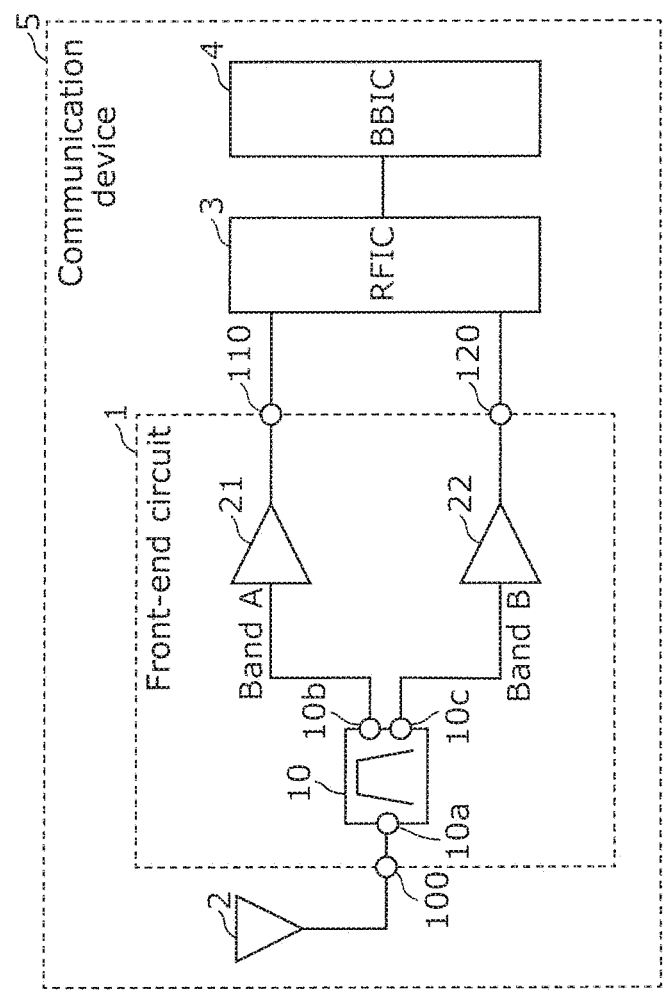
FIG. 1 is a circuit configuration diagram illustrating a front-end circuit and a communication device according to Embodiment 1.

Hereinafter, embodiments of the present disclosure will be described in detail with reference to the drawings. It should be noted that each of the embodiments described below shows a general or specific example. The numerical values, shapes, materials, constituent elements, the arrangement and connection of the constituent elements, etc. indicated in the following embodiments are mere examples, and are therefore not intended to limit the present disclosure.

Thus, among the constituent elements in the following embodiments, those not recited in any independent claim are described as optional constituent elements. In addition, the sizes of constituent elements and the ratios of the sizes illustrated in the drawings are not necessarily strictly accurate.

Embodiment 1

[1.1 Configurations of Front-End Circuit 1 and Communication Device 5]

FIG. 1 is a circuit configuration diagram illustrating front-end circuit 1 and communication device 5 according to Embodiment 1. As illustrated in FIG. 1, communication device 5 includes front-end circuit 1, antenna 2, radio frequency signal processing circuit (RFIC) 3, and baseband signal processing circuit (BBIC) 4.

RFIC 3 processes radio frequency signals transmitted and received by antenna 2. Specifically, RFIC 3 processes a radio frequency received signal inputted via a received signal path of front-end circuit 1, by down-conversion, for example, and outputs a received signal generated by being processed to BBIC 4. In addition, RFIC 3 may further process a signal to be transmitted inputted from BBIC 4, by up-conversion, for example, and output a radio frequency transmission signal generated by being processed to a transmission signal path.

Moreover, RFIC 3 may include a controller that controls a gain of an amplifier and ON and OFF of a switch (not shown in FIG. 1) included in front-end circuit 1, according to at least one of a frequency of a radio frequency signal to be transferred through communication device 5, the receiving sensitivity of front-end circuit 1, or the antenna sensitivity of antenna 2. It should be noted that the controller may be disposed outside RFIC 3, and may be provided in, for example, front-end circuit 1 or BBIC 4.

BBIC 4 performs signal processing using an intermediate frequency band lower than the frequency band of a radio frequency signal transferred through front-end circuit 1. A signal processed by BBIC 4 is used as, for example, an image signal for displaying an image or an audio signal for talking via a loudspeaker.

Antenna 2 is connected to antenna terminal 100 of front-end circuit 1. Antenna 2 receives a radio frequency signal from outside and outputs the radio frequency signal to front-end circuit, and radiates a radio frequency signal outputted from RFIC 3.

It should be noted that in communication device 5 according to the present embodiment, antenna 2 and BBIC 4 are not essential constituent elements.

Front-end circuit 1 includes filter 10 and low-noise amplifiers 21 and 22. A radio frequency signal received by antenna 2 is inputted to front-end circuit 1 via antenna terminal 100, and radio frequency signals transferred through front-end circuit 1 are outputted from reception output terminals 110 and 120 to RFIC 3.

Filter 10 is an example of a first filter, and includes input terminal 10a (first input terminal), output terminal 10b (first output terminal), and output terminal 10c (second output terminal). Filter 10 converts an unbalanced radio frequency signal inputted to input terminal 10a into two balanced radio frequency signals, and outputs one of the two balanced radio frequency signals from output terminal 10b and the other of the two balanced radio frequency signals from output terminal 10c. It should be noted that the one of the two balanced radio frequency signals outputted from output terminal 10b is inputted as a first radio frequency signal that is unbalanced, to low-noise amplifier 21. Further, the other of the two balanced radio frequency signals outputted from output terminal 10c is inputted as a second radio frequency signal that is unbalanced, to low-noise amplifier 22. As a result, the first radio frequency signal and the second radio frequency signal are in antiphase.

Filter 10 has a first passband between input terminal 10a and output terminal 10b, and has a second passband between input terminal 10a and output terminal 10c. The first passband corresponds to, for example, Band A (communication band A), and the second passband corresponds to, for example, Band B (communication band B). In other words, the first radio frequency signal mainly contains frequency components in Band A (the first passband), and the second radio frequency signal mainly contains frequency components in Band B (the second passband).

It should be noted that filter 10 may be, for example, any of an acoustic wave filter that uses surface acoustic waves (SAWs), an acoustic wave filter that uses bulk acoustic waves (BAWs), an LC resonant filter, an LC resonant circuit including an acoustic wave resonator, and a dielectric filter. Further, filter 10 is not limited to these. When filter 10 is an acoustic wave filter that uses SAWs, filter 10 achieves unbalanced input and balanced output by including a vertically coupled surface acoustic wave filter.

Low-noise amplifier 21 is an example of a first low-noise amplifier, is connected to output terminal 10b, and amplifies the first radio frequency signal in the first passband outputted from output terminal 10b.

Low-noise amplifier 22 is an example of a second low-noise amplifier, is connected to output terminal 10c, and amplifies the second radio frequency signal in the second passband outputted from output terminal 10c.

Low-noise amplifiers 21 and 22 are each configured as, for example, a silicon (Si) complementary metal oxide semiconductor (CMOS), a Gallium Arsenide (GaAs) field-effect transistor (FET), or a hetero bipolar transistor (HBT).

According to the above configurations of front-end circuit 1 and communication device 5, one filter 10 having a band selection function and an unbalanced-to-balanced conversion function simultaneously transfers the first radio frequency signal in communication band A and the second radio frequency signal in communication band B. In consequence, it is possible to provide small front-end circuit 1 and small communication device 5 that simultaneously transfer radio frequency signals. Moreover, since radio frequency signals for which filter 10 has reduced unnecessary signals other than signals in the first passband and the second passband are inputted to low-noise amplifiers 21 and 22, it is possible to reduce the distortion of amplified signals outputted from low-noise amplifiers 21 and 22.

Since each of the first radio frequency signal and the second radio frequency signal that pass through filter 10 is subjected to balanced division, each of the first radio frequency signal and the second radio frequency signal has low power, compared to a radio frequency signal inputted to filter 10. In this case, since front-end circuit 1 includes low-noise amplifiers 21 and 22, low-noise amplifiers 21 and 22 amplify with low noise the first radio frequency signal and the second radio frequency signal that have passed through filter 10. As a result, it is possible to simultaneously transfer the first radio frequency signal and the second radio frequency signal having passed through filter 10, without attenuating power thereof.

It should be noted that at least one of gains of low-noise amplifiers 21 and 22 or the frequency range of the passband of filter 10 may be caused to change dynamically in accordance with at least one of the frequency ranges of communication bands A and B, the receiving sensitivity of communication device 5, or the antenna sensitivity of antenna 2. With this, it is possible to improve the receiving sensitivity of front-end circuit 1 and communication device 5.

In other words, low-noise amplifiers 21 and 22 may each be a variable amplifier having a variable gain, and filter 10 may be a variable filter having a variable passband.

[1.2 Configurations of Front-End Circuit 1A and Communication Device 5A According to Variation 1]

Figure 2:
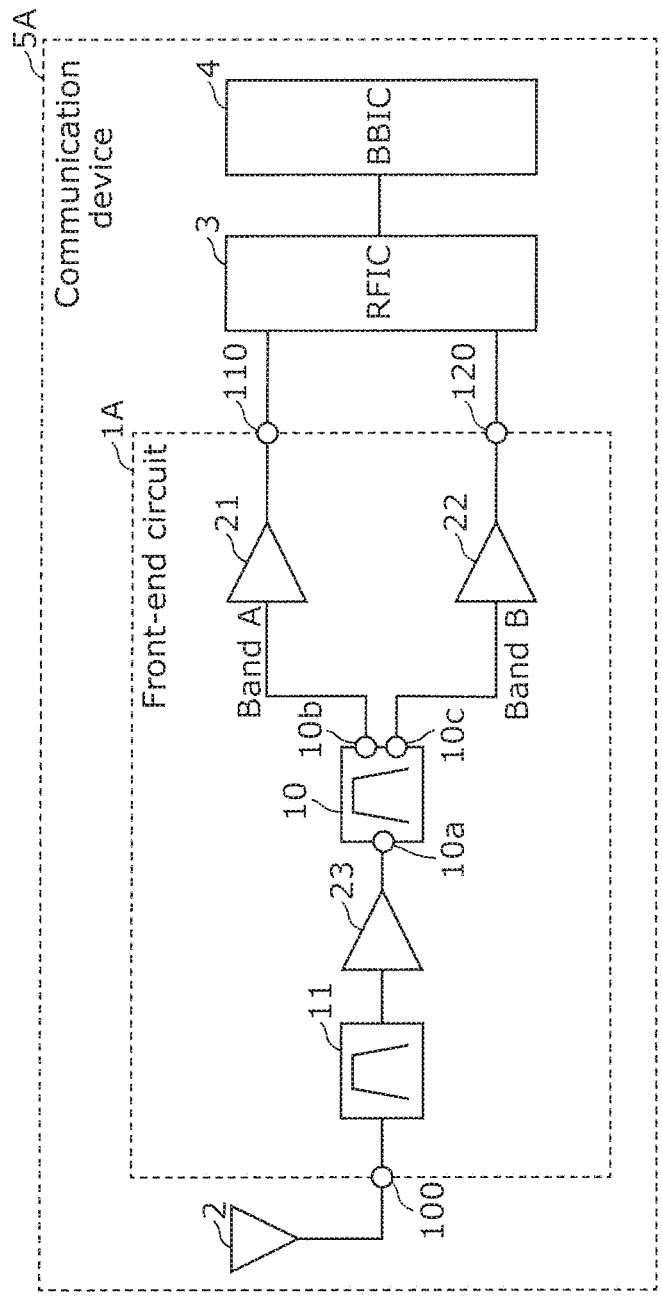
FIG. 2 is a circuit configuration diagram illustrating a front-end circuit and a communication device according to Variation 1 of Embodiment 1.

FIG. 2 is a circuit configuration diagram illustrating front-end circuit 1A and communication device 5A according to Variation 1 of Embodiment 1. As illustrated in FIG. 2, communication device 5A includes front-end circuit 1A, antenna 2, RFIC 3, and BBIC 4. Communication device 5A according to the present variation differs from communication device 5 according to Embodiment 1 only in the configuration of front-end circuit 1A. Front-end circuit 1A according to the present variation differs from front-end circuit 1 according to Embodiment 1 in that filter 11 and low-noise amplifier 23 are added. In what follows, a description of similarities in configuration between front-end circuit 1A and communication device 5A according to the present variation and front-end circuit 1 and communication device 5 according to Embodiment 1 is omitted, and differences in configuration therebetween are mainly described.

Front-end circuit 1A includes filters 10 and 11 and low-noise amplifiers 21, 22, and 23.

Filter 11 is an example of a second filter, and has a third passband. The third passband encompasses the first passband and the second passband of filter 10. It should be noted that filter 11 may be, for example, any of an acoustic wave filter that uses SAWs, an acoustic wave filter that uses BAWs, an LC resonant filter, an LC resonant circuit including an acoustic wave resonator, and a dielectric filter. Further, filter 11 is not limited to these.

Low-noise amplifier 23 is an example of a third low-noise amplifier, and amplifies a radio frequency signal in the third passband outputted from filter 11. It should be noted that low-noise amplifier 23 is configured as, for example, a silicon (Si) complementary metal oxide semiconductor (CMOS), a Gallium Arsenide (GaAs) field-effect transistor (FET), or a hetero bipolar transistor (HBT).

Low-noise amplifier 23 has an output end connected to input terminal 10a of filter 10, and an input end connected to an output end of filter 11. Filter 11 has an input end connected to antenna terminal 100.

Front-end circuits 1 and 1A and communication devices 5 and 5A support, for example, a communication scheme in which different communication systems are simultaneously used. Examples of the different communication systems include the fourth generation communication system (4G) and the fifth generation communication system (5G).

In Non-StandAlone New Radio (NSA-NR) that is communication architecture being introduced in recent years, a 5G New Radio (NR) communication area is established in a 4G Long-Term Evolution (LTE) communication area, and communication control in conformance to both 5G NR and 4G LTE is performed using a 4G LTE control channel. It should be noted that NSA is defined in, for example, TR 38.801 that is a technical report on network architecture.

For the above reason, NSA-NR relies on simultaneously connecting a 4G LTE transfer circuit and a 5G NR transfer circuit to a communication line, using 4G LTE as a master and 5G NR as a slave (EN-DC: LTE-NR Dual Connectivity).

In order to achieve this, in front-end circuit 1A and communication device 5A according to the present variation, a 4G LTE transfer circuit and a 5G NR transfer circuit are connected to one antenna 2. The 4G LTE transfer circuit includes, for example, output terminal 10c, low-noise amplifier 22, and reception output terminal 120. The 5G NR transfer circuit includes, for example, output terminal 10b, low-noise amplifier 21, and reception output terminal 110. As the first example of application of communication bands in front-end circuit 1A and communication device 5A, for example, Band 5 (receiving band: 869 to 894 MHz) of 4G LTE is applied to Band B (the second passband), and n 5 (receiving band: 869 to 894 MHz) of 5G NR is applied to Band A (the first passband). RFIC 3 extracts data of 5G from the first radio frequency signal having passed through filter 10, and extracts data of 4G from the second radio frequency signal having passed through filter 10.

It should be noted that the front-end circuit and the communication device according to the present disclosure conform to TS 38.101-3, a technical specification, in which a combination of communication bands that at least partially overlap each other, as illustrated by Band 5 of 4G LTE and n 5 of 5G NR, is defined.

Figure 3A:
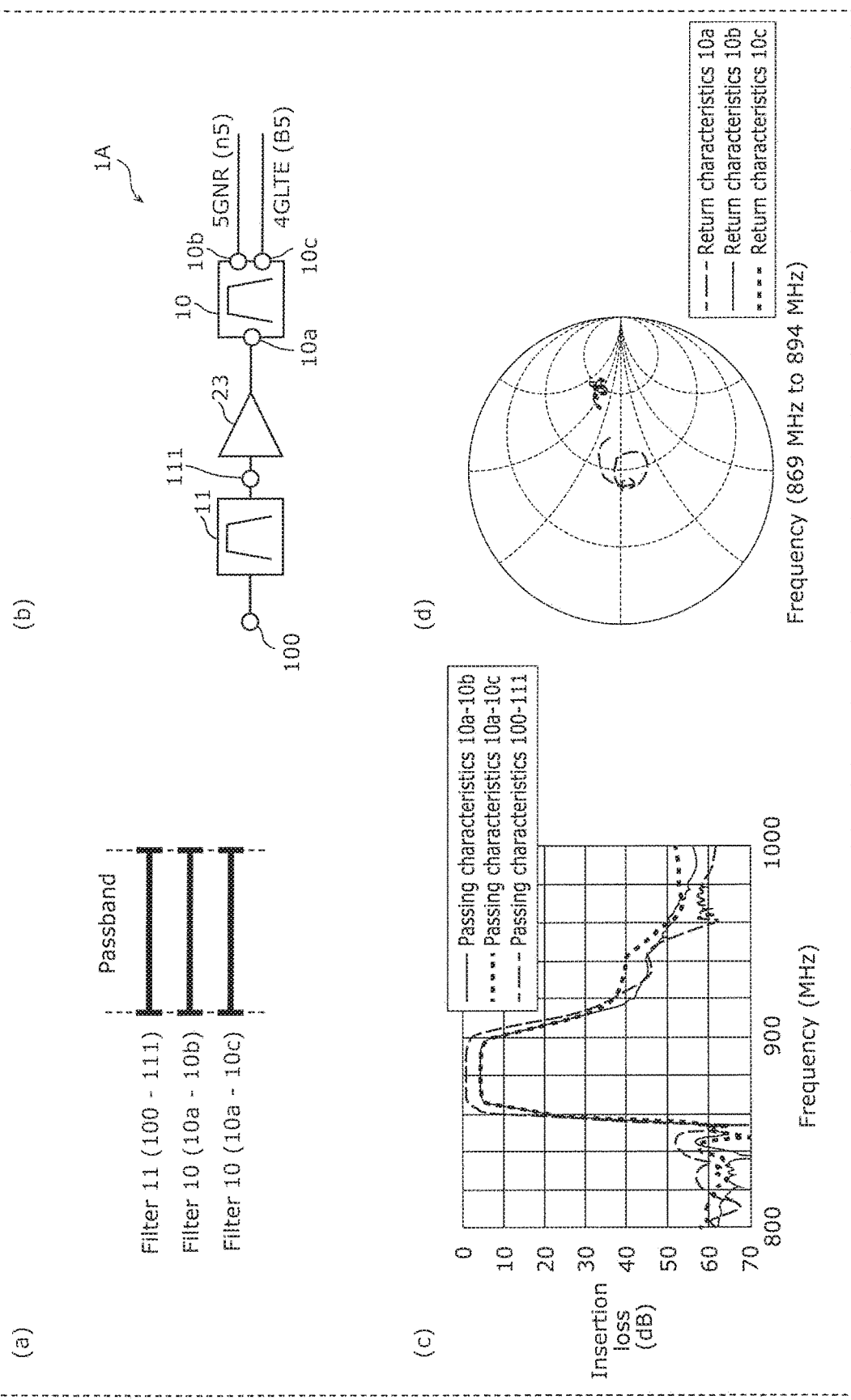
FIG. 3A is a diagram illustrating a circuit configuration, passing characteristics, and return characteristics of the front-end circuit according to Variation 1 of Embodiment 1.

FIG. 3A is a diagram illustrating a circuit configuration, passing characteristics, and return characteristics of front-end circuit 1A according to Variation 1 of Embodiment 1. FIG. 3A illustrates a frequency relationship between the passbands of filters 10 and 11 included in front-end circuit 1A according to Variation 1 of Embodiment 1 (as shown in the upper-left); a circuit (hereinafter referred to as a balanced output circuit) obtained by extracting filters 10 and 11 and low-noise amplifier 23 from front-end circuit 1A according to Variation 1 of Embodiment 1 (as shown in the upper-right); passing characteristics of filters 10 and 11 (as shown in the bottom-left); and return (impedance) characteristics of filter 10 (as shown in the bottom-right).

Figure 3B:
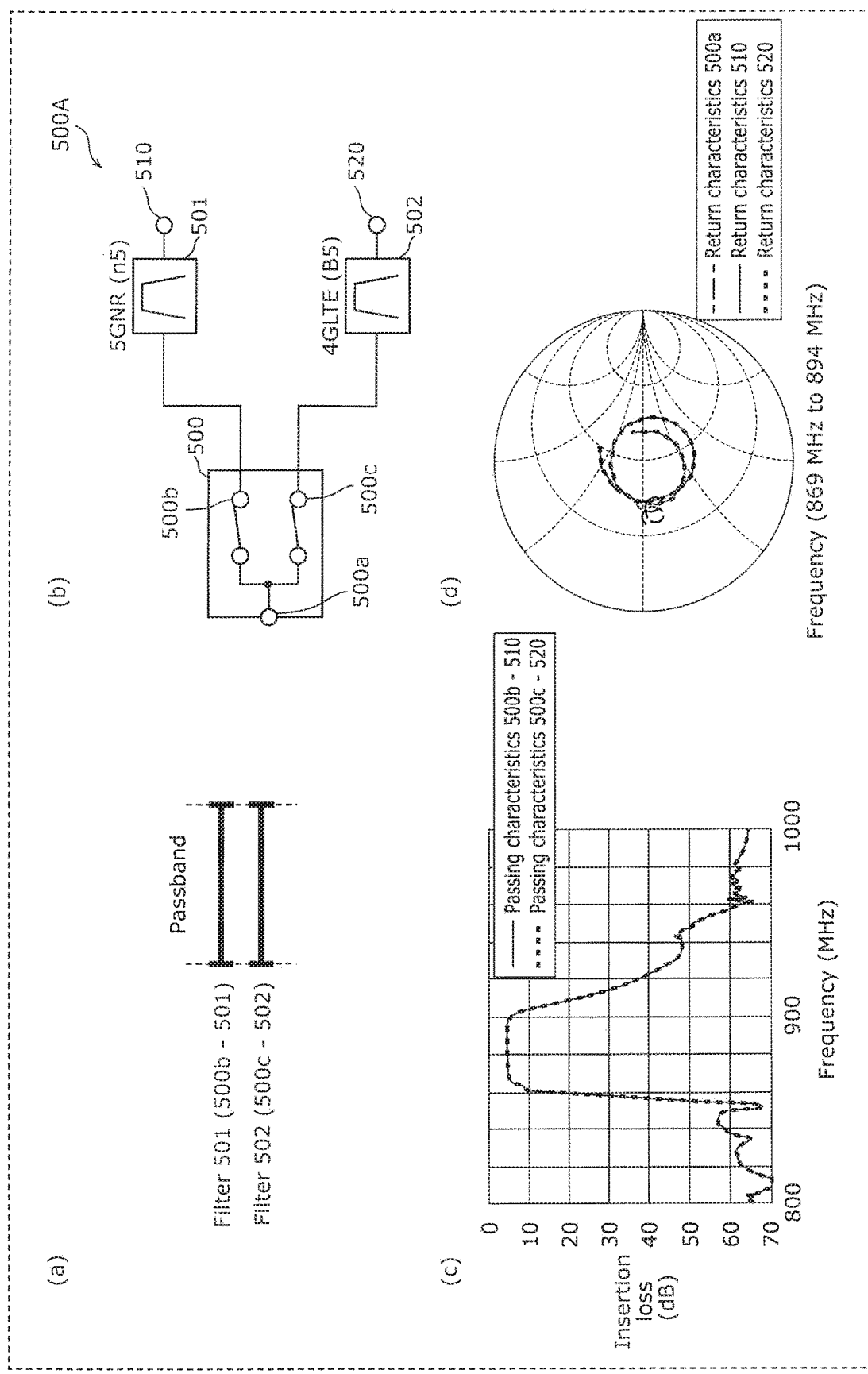
FIG. 3B is a diagram illustrating a circuit configuration, passing characteristics, and return characteristics of a front-end circuit according to a comparative example.

FIG. 3B is a diagram illustrating a circuit configuration, passing characteristics, and return characteristics of front-end circuit 500A according to a comparative example. It should be noted that front-end circuit 500A according to the comparative example differs from front-end circuit 1A according to Variation 1 of Embodiment 1 in that switch 500 and filters 501 and 502 are disposed in place of filter 10. Filter 501 is an unbalanced input-unbalanced output filter having the first passband. Filter 502 is an unbalanced input-unbalanced output filter having the second passband. Switch 500 includes common terminal 500a and selection terminals 500b and 500c. Common terminal 500a is connected to an output end of low-noise amplifier 23, selection terminal 500b is connected to an input end of filter 501, and selection terminal 500c is connected to an input end of filter 502.

FIG. 3B illustrates a frequency relationship between the passbands of filters 501 and 502 included in front-end circuit 500A according to the comparative example (as shown in the upper-left); a circuit (hereinafter referred to as a switch circuit) obtained by extracting filters 501 and 502 from front-end circuit 500A according to the comparative example (as shown in the upper-right); passing characteristics of filters 501 and 502 (as shown in the bottom-left); and return (impedance) characteristics of the switch circuit (as shown in the bottom-right).

As illustrated in FIG. 3A, in front-end circuit 1A according to the present variation, the first passband and the second passband of filter 10 are identical. As illustrated in FIG. 3B, in front-end circuit 500A according to the comparative example, the first passband of filter 501 and the second passband of filter 502 are identical. As further illustrated in FIG. 3B, in front-end circuit 500A according to the comparative example, in order to achieve 5G NR and 4G LTE EN-DC, switch 500 connects common terminal 500a and selection terminal 500b, and connects common terminal 500a and selection terminal 500c.

As further illustrated in FIG. 3B, in front-end circuit 500A according to the comparative example, the passing characteristics of filters 501 and 502 are favorable. Although not shown, both insertion loss in the first passband of filter 501 and insertion loss in the second passband of filter 502 are greater than insertion loss in the first passband (and the second passband) of filter 11 by approximately 3 dB. In other words, a radio frequency signal inputted to common terminal 500a is approximately equally divided into the first radio frequency signal outputted from reception terminal 510 and the second radio frequency signal outputted from reception terminal 520. As further illustrated in FIG. 3B, however, the isolation characteristics of switch 500 cause a variation in impedance of the first passband in reception terminal 510 to be greater (a degree of concentration of a spiral to be lower), and a variation in impedance of the second passband in reception terminal 520 to be also greater (a degree of concentration of a spiral to be lower). This causes an impedance mismatch between filters 501 and 502 and low-noise amplifiers 21 and 22 disposed downstream to be greater. Consequently, it is not possible to simultaneously transfer the first radio frequency signal having passed through filter 501 and the second radio frequency signal having passed through filter 502 at high quality. It should be noted that "a degree of concentration of a spiral" refers to a degree of concentration of a locus of impedances on a Smith chart.

In contrast, as further illustrated in FIG. 3A, in front-end circuit 1A according to the present variation, both the passing characteristics in the first passband between input terminal 10a and output terminal 10b of filter 10 and the passing characteristics in the second passband between input terminal 10a and output terminal 10c of filter 10 are almost identical, and are at low loss. It should be noted that although the passing characteristics of filter 11 are illustrated in FIG. 3A, both insertion loss in the first passband of filter 10 and insertion loss in the second passband of filter 10 are greater than insertion loss in the first passband (and the second passband) of filter 11 by approximately 3 dB. In other words, a radio frequency signal inputted to input terminal 10a is approximately equally divided into the first radio frequency signal outputted from output terminal 10b and the second radio frequency signal outputted from output terminal 10c. Here, as illustrated in FIG. 3A, in filter 10, a variation in impedance of the first passband in output terminal 10b is small (a degree of concentration of a spiral is high), and a variation in impedance of the second passband in output terminal 10c is also small (a degree of concentration of a spiral is high). As a result, for example, it is possible to accurately put the output impedance of filter 10 in output terminal 10b and the input impedance of low-noise amplifier 21 in a complex conjugate relationship. Moreover, for example, it is possible to accurately put the output impedance of filter 10 in output terminal 10c and the input impedance of low-noise amplifier 22 in a complex conjugate relationship. This causes an impedance match between filter 10 and low-noise amplifiers 21 and 22 disposed downstream to be favorable. Consequently, it is possible to simultaneously transfer the first radio frequency signal outputted from output terminal 10b and the second radio frequency signal outputted from output terminal 10c at high quality.

Figure 4A:
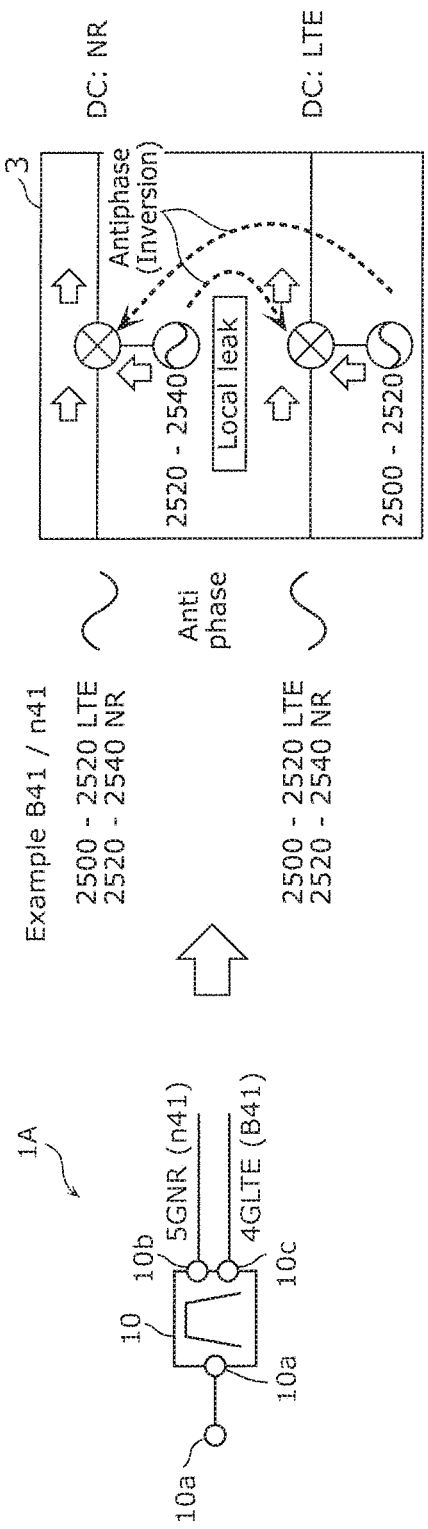
FIG. 4A is a diagram illustrating noise reduction in the communication device according to Variation 1 of Embodiment 1.
Figure 4B:
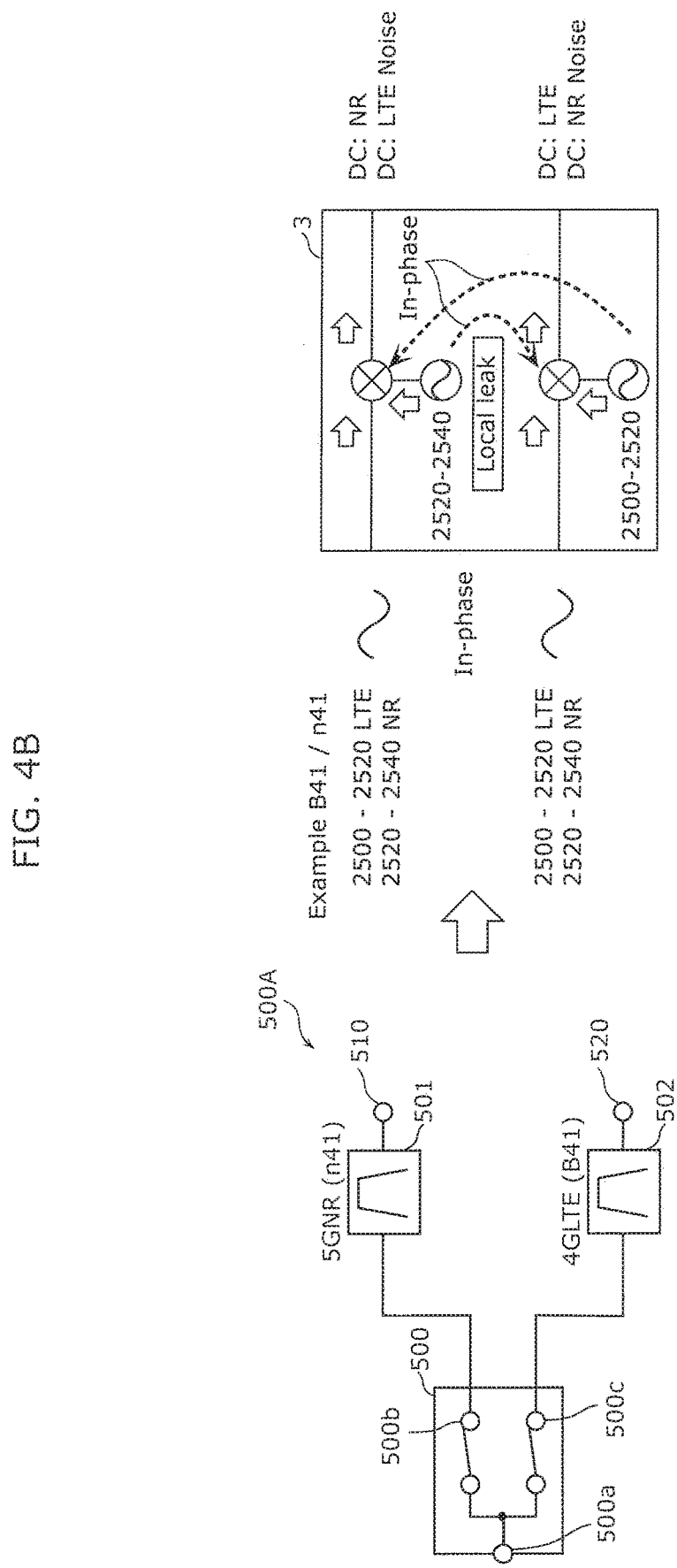
FIG. 4B is a diagram illustrating noise generation in a communication device according to the comparative example.

FIG. 4A is a diagram illustrating noise reduction in communication device 5A according to Variation 1 of Embodiment 1. FIG. 4B is a diagram illustrating noise generation in a communication device according to the comparative example. It should be noted that, here, as illustrated in FIG. 4A, a circuit between input terminal 10a and output terminal 10c is a 4G LTE transfer circuit, and Band 41 (transmission and receiving band: 2496 to 2690 MHz) is applied as Band B (the second passband), for example. In addition, a circuit between input terminal 10a and output terminal 10b is a 5G NR transfer circuit, and n 41 (transmission and receiving band: 2496 to 2690 MHz) is applied as Band A (the first passband), for example. It should be noted that, as illustrated in FIG. 4B, a circuit including selection terminal 500c and filter 502 is a 4G LTE transfer circuit, and Band 41 is applied as Band B (the second passband), for example. In addition, a circuit including selection terminal 500b and filter 501 is a 5G NR transfer circuit, and n 41 is applied as Band A (the first passband), for example.

First, as illustrated in FIG. 4B, in the case of the communication device according to the comparative example, the first radio frequency signal outputted from reception terminal 510 of front-end circuit 500A includes signal components in a first channel (2500 to 2520 MHz) of Band 41 of 4G LTE, and signal components in a second channel (2520 to 2540 MHz) of n 41 of 5G NR. Accordingly, the second radio frequency signal outputted from reception terminal 520 of front-end circuit 500A also includes the signal components in the first channel of Band 41 of 4G LTE, and the signal components in the second channel of n 41 of 5G NR.

At this time, as illustrated by the right part of FIG. 4B, RFIC 3 extracts data of 5G included in the second channel of n 41 of 5G NR from the first radio frequency signal outputted from reception terminal 510 and amplified by low-noise amplifier 21. Specifically, the first radio frequency signal and a first locally generated (local) signal (2520 to 2540 MHz) having a frequency close to a frequency of the second channel of n 41 of 5G NR are inputted to a first mixer. In consequence, the data of 5G included in the first radio frequency signal is extracted as a first intermediate frequency signal having a lower frequency than the first radio frequency signal.

Moreover, RFIC 3 extracts data of 4G included in the first channel of Band 41 of 4G LTE from the second radio frequency signal outputted from reception terminal 520 and amplified by low-noise amplifier 22. Specifically, the second radio frequency signal and a second locally generated (local) signal (2500 to 2520 MHz) having a frequency close to a frequency of the first channel of Band 41 of 4G LET are inputted to a second mixer. In consequence, the data of 4G included in the second radio frequency signal is extracted as a second intermediate frequency signal having a lower frequency than the second radio frequency signal.

Here, in the communication device according to the comparative example, the first radio frequency signal outputted from low-noise amplifier 21 and the second radio frequency signal outputted from low-noise amplifier 22 are in-phase. For this reason, the first locally generated signal and the second locally generated signal are in-phase. As a result, the second locally generated signal is leakily inputted to the first mixer, and an unnecessary intermediate frequency signal (LTE noise) corresponding to the signal components in the first channel of Band 41 of 4G LTE is generated from the first radio frequency signal. In addition, the first locally generated signal is leakily inputted to the second mixer, and an unnecessary intermediate frequency signal (NR noise) corresponding to the signal components in the second channel of n 41 of 5G NR is generated from the second radio frequency signal. In other words, it is not possible to simultaneously receive the data of 5G NR included in the first radio frequency signal and the data of 4G LTE included in the second radio frequency signal at high quality.

In contrast, in communication device 5A according to Variation 1 of Embodiment 1, the first radio frequency signal outputted from low-noise amplifier 21 and the second radio frequency signal outputted from low-noise amplifier 22 are in antiphase. For this reason, the first locally generated signal and the second locally generated signal are in antiphase. As a result, since the second locally generated signal is in antiphase with the first locally generated signal even when the second locally generated signal is leakily inputted to the first mixer, the generation of an unnecessary intermediate frequency signal (LTE noise) corresponding to the signal components in the first channel of Band 41 of 4G LTE from the first radio frequency signal is reduced. In addition, since the first locally generated signal is in antiphase with the second locally generated signal even when the first locally generated signal is leakily inputted to the second mixer, the generation of an unnecessary intermediate frequency signal (NR noise) corresponding to the signal components in the second channel of n 41 of 5G NR from the second radio frequency signal is reduced. In other words, it is possible to simultaneously receive the data of 5G NR included in the first radio frequency signal and the data of 4G LTE included in the second radio frequency signal at high quality.

In front-end circuit 1A and communication device 5A according to the present variation, low-noise amplifier 23 is disposed upstream of filter 10. Since low-noise amplifiers 21 and 22 disposed downstream of filter 10 amplify radio frequency signals having an S/N ratio reduced as a result of passing through filter 10, low-noise amplifiers 21 and 22 amplify the radio frequency signals with the reduced S/N ratio maintained. In contrast, since low-noise amplifier 23 disposed upstream of filter 10 amplifies a radio frequency signal having an S/N ratio not reduced upstream of filter 10, low-noise amplifier 23 suppresses the reduction of the S/N ratio of the radio frequency signal outputted from front-end circuit 1A to RFIC 3.

When low-noise amplifier 23 is disposed upstream of filter 10, it is desirable that filter 11 be disposed. With this, it is possible to reduce the distortion of an amplified signal outputted from low-noise amplifier 23 caused by unnecessary radio frequency components other than the third passband.

At least one of a gain of low-noise amplifier 23 or a frequency range of a passband of filter 11 may be caused to change dynamically in accordance with at least one of the frequency ranges of communication bands A and B, the receiving sensitivity of front-end circuit 1A, or the antenna sensitivity of antenna 2. With this, it is possible to improve the receiving sensitivity of front-end circuit 1A and communication device 5A.

In other words, low-noise amplifier 23 may be a variable amplifier having a variable gain, and filter 11 may be a variable filter having a variable passband.

[1.3 Second Example of Application of Communication Bands in Front-end Circuit 1 and Communication Device 5]

Figure 5:
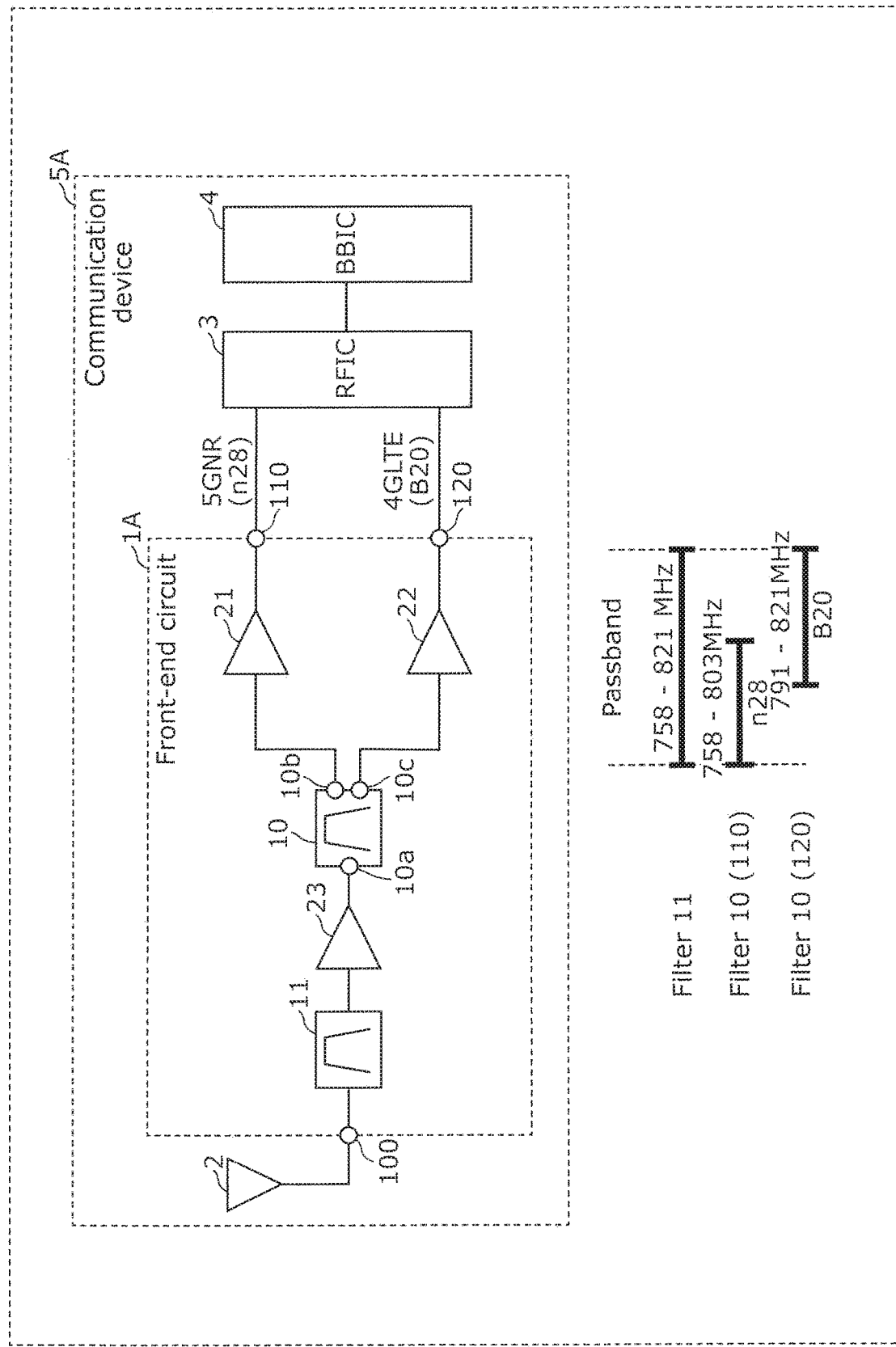
FIG. 5 is a circuit configuration diagram illustrating the second example of application of communication bands in the front-end circuit and the communication device according to Variation 1 of Embodiment 1.

FIG. 5 is a circuit configuration diagram illustrating the second example of application of communication bands in front-end circuit 1A and communication device 5A according to Variation 1 of Embodiment 1. As the second example of application of communication bands in front-end circuit 1A and communication device 5A, for example, Band 20 (receiving band: 791 to 821 MHz) of 4G LTE is applied to Band B (second passband), and n 28 (receiving band: 758 to 803 MHz) of 5G NR is applied to Band A (first passband). RFIC 3 extracts data of 5G from the first radio frequency signal having passed through filter 10, and extracts data of 4G from the second radio frequency signal having passed through filter 10.

In the above second example of application, the first passband and the second passband of filter 10 have frequency ranges including at least an overlapping portion (791 to 803 MHz) and non-overlapping portions (758 to 791 MHz, 803 to 821 MHz).

Filter 10 is capable of making the first passing characteristics between input terminal 10a and output terminal 10b and the second passing characteristics between input terminal 10a and output terminal 10c different. For example, when filter 10 is a vertically coupled filter that uses SAWs, filter 10 is capable of making the first passing characteristics and the second passing characteristics different, and causing both the first passing characteristics and the second passing characteristics to be low-loss, by optimizing electrode parameters of interdigital transducer (IDT) electrodes aligned along an acoustic wave propagation direction.

In the above second example of application, since it is also possible to cause a variation in impedance of the first passband in output terminal 10b of filter 10 and a variation in impedance of the second passband in output terminal 10c of filter 10 to be small (a degree of concentration of a spiral to be higher), an impedance match between filter 10 and low-noise amplifiers 21 and 22 disposed downstream is caused to be favorable. Accordingly, it is possible to simultaneously transfer the first radio frequency signal outputted from output terminal 10b and the second radio frequency signal outputted from output terminal 10c at high quality.

[1.4 Third Example of Application of Communication Bands in Front-end Circuit 1A and Communication Device 5A]

Figure 6:
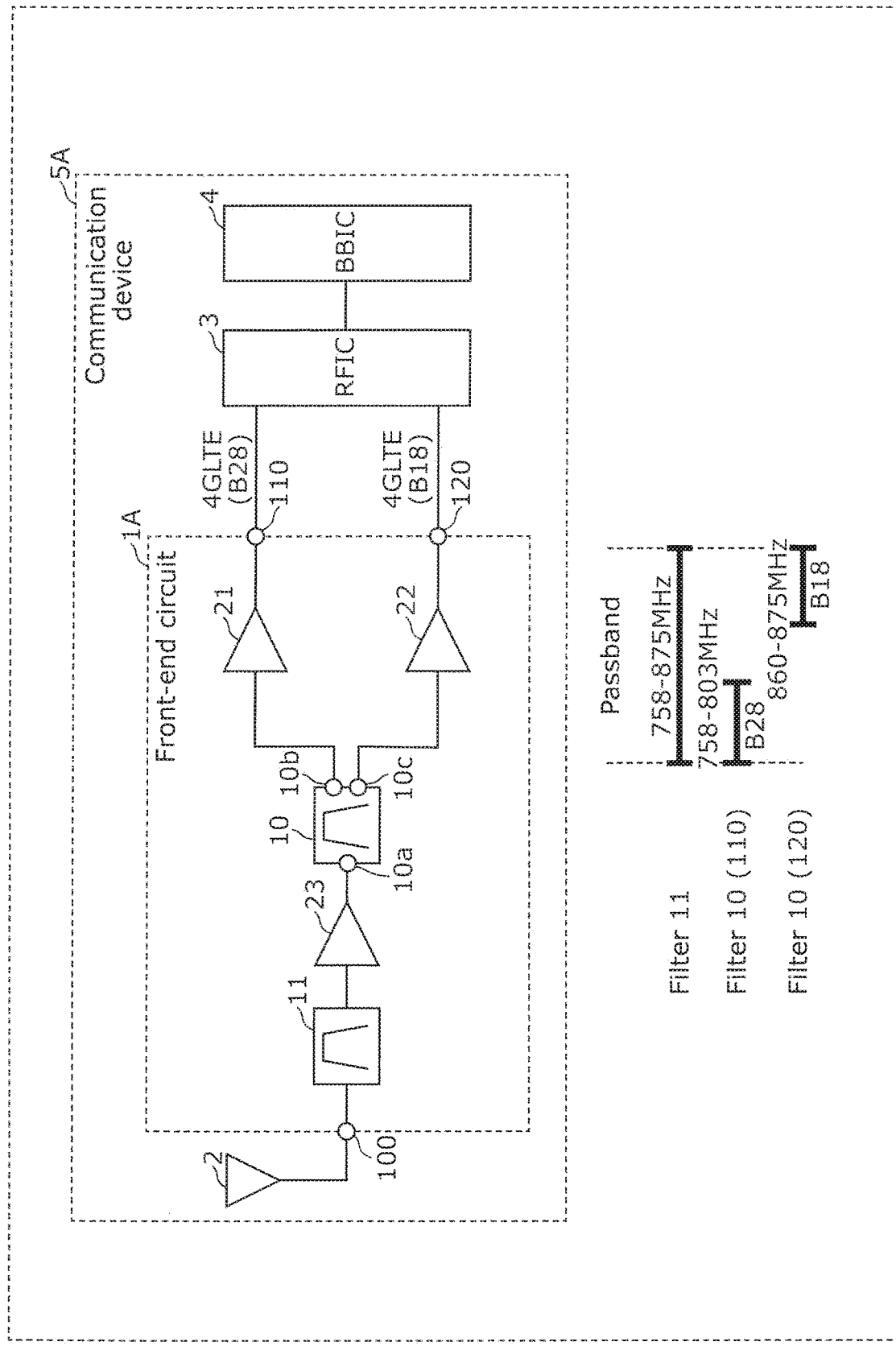
FIG. 6 is a circuit configuration diagram illustrating the third example of application of communication bands in the front-end circuit and the communication device according to Variation 1 of Embodiment 1.

FIG. 6 is a circuit configuration diagram illustrating the third example of application of communication bands in front-end circuit 1A and communication device 5A according to Variation 1 of Embodiment 1. As the third example of application of communication bands in front-end circuit 1A and communication device 5A, for example, Band 18 (receiving band: 860 to 875 MHz) of 4G LTE is applied to Band B (second passband), and n 28 (receiving band: 758 to 803 MHz) of 4G LTE is applied to Band A (first passband). RFIC 3 extracts data of 4G from the first radio frequency signal having passed through filter 10, and also extracts data of 4G from the second radio frequency signal having passed through filter 10.

In the above third example of application, front-end circuit 1A and communication device 5A support a communication scheme in which a single communication system (4G) is used, and perform simultaneous reception (carrier aggregation (CA)) of a radio frequency signal in Band 28 of LTE and a radio frequency signal of Band 18 of LTE. Here, the first passband and the second passband have frequency ranges at least one of which includes a non-overlapping portion.

In the above third example of application, since it is also possible to cause a variation in impedance of the first passband in output terminal 10b of filter 10 and a variation in impedance of the second passband in output terminal 10c of filter 10 to be small (a degree of concentration of a spiral to be higher), an impedance match between low-noise amplifiers 21 and 22 disposed downstream of filter 10 is caused to be favorable. Accordingly, it is possible to perform CA of the first radio frequency signal outputted from output terminal 10b and the second radio frequency signal outputted from output terminal 10c at high quality.

[1.5 Configurations of Front-end Circuit 1B and Communication Device 5B According to Variation 2]

Figure 7:
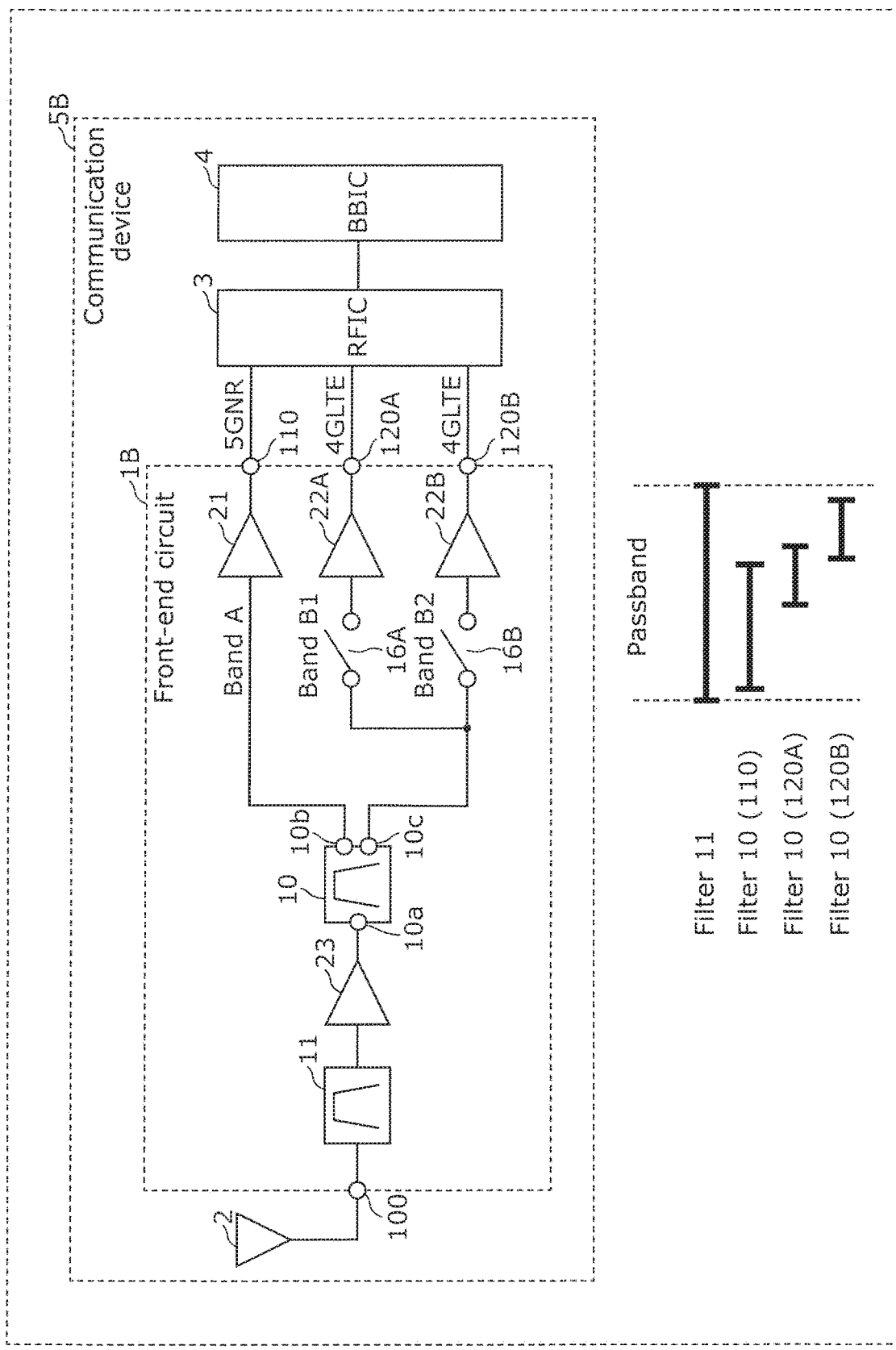
FIG. 7 is a circuit configuration diagram illustrating a front-end circuit and a communication device according to Variation 2 of Embodiment 1.

FIG. 7 is a circuit configuration diagram illustrating front-end circuit 1B and communication device 5B according to Variation 2 of Embodiment 1. As illustrated in FIG. 7, communication device 5B includes front-end circuit 1B, antenna 2, RFIC 3, and BBIC 4. Communication device 5B according to the present variation differs from communication device 5A according to Variation 1 of Embodiment 1 only in the configuration of front-end circuit 1B. Front-end circuit 1B according to the present variation differs from front-end circuit 1A according to Variation 1 of Embodiment 1 in that a switch and two low-noise amplifiers are disposed downstream of output terminal 10c, and in a frequency relationship between passbands of filters. In what follows, a description of similarities in configuration between front-end circuit 1B and communication device 5B according to the present variation and front-end circuit 1A and communication device 5A according to Variation 1 of Embodiment 1 is omitted, and differences in configuration therebetween are mainly described.

Front-end circuit 1B includes filters 10 and 11, low-noise amplifiers 21, 22A, 22B, and 23, and switches 16A and 16B.

Filter 10 is an example of the first filter, and has a first passband and a second passband. The first passband and the second passband have frequency ranges that at least partially overlap each other. The first passband corresponds to, for example, Band A (communication band A) of 5G NR. The second passband encompasses, for example, Band B1 (communication band B1) of 4G LTE and Band B2 (communication band B2) of 4G LTE. Filter 10 has output terminal 10b connected to an input end of low-noise amplifier 21, and output terminal 10c connected to one ends of switches 16A and 16B.

Low-noise amplifier 22A is an example of the second low-noise amplifier, and amplifies a radio frequency signal in Band B1 outputted from output terminal 10c. Low-noise amplifier 22B is an example of the second low-noise amplifier, and amplifies a radio frequency signal in Band B2 outputted from output terminal 10c. It should be noted that low-noise amplifiers 22A and 22B are each configured as, for example, a silicon (Si) complementary metal oxide semiconductor (CMOS), a Gallium Arsenide (GaAs) field-effect transistor (FET), or a hetero bipolar transistor (HBT).

Low-noise amplifier 22A has an input end connected to the other end of switch 16A, and an output end connected to reception output terminal 120A. Low-noise amplifier 22B has an input end connected to the other end of switch 16B, and an output end connected to reception output terminal 120B.

The first passband (Band A) and the second passband (Band B1+B2) of filter 10 have frequency ranges that partially overlap each other. More specifically, the first passband (Band A) of filter 10 and Band B1 of 4G LTE have frequency ranges that partially overlap each other. Further, Band B1 and Band B2 of 4G LTE have frequency ranges that partially overlap each other.

Here, switches 16A and 16B do not simultaneously become conductive. In other words, a radio frequency signal in Band B1 of 4G LTE and a radio frequency signal in Band B2 of 4G LTE are not simultaneously transferred.

According to the above configuration, when switch 16 is conductive, a radio frequency signal in Band A of 5G NR and a radio frequency signal in Band B1 of 4G LTE are simultaneously transferred. Moreover, when switch 16B is conductive, a radio frequency signal in Band A of 5G NR and a radio frequency signal in Band B2 of 4G LTE are simultaneously transferred.

When the first passband and the second passband of filter 10 at least partially overlap each other, the above configurations of front-end circuit 1B and communication device 5B according to the present variation make it possible to simultaneously transfer the first radio frequency signal outputted from output terminal 10b and the second radio frequency signal outputted from output terminal 10c at high quality. In addition, the configurations make it possible to simultaneously select a communication band of 4G LTE and transfer the radio frequency signal in Band A of 5G NR.

[1.6 Configurations of Front-end Circuit 1C and Communication Device 5C According to Variation 3]

Figure 8:
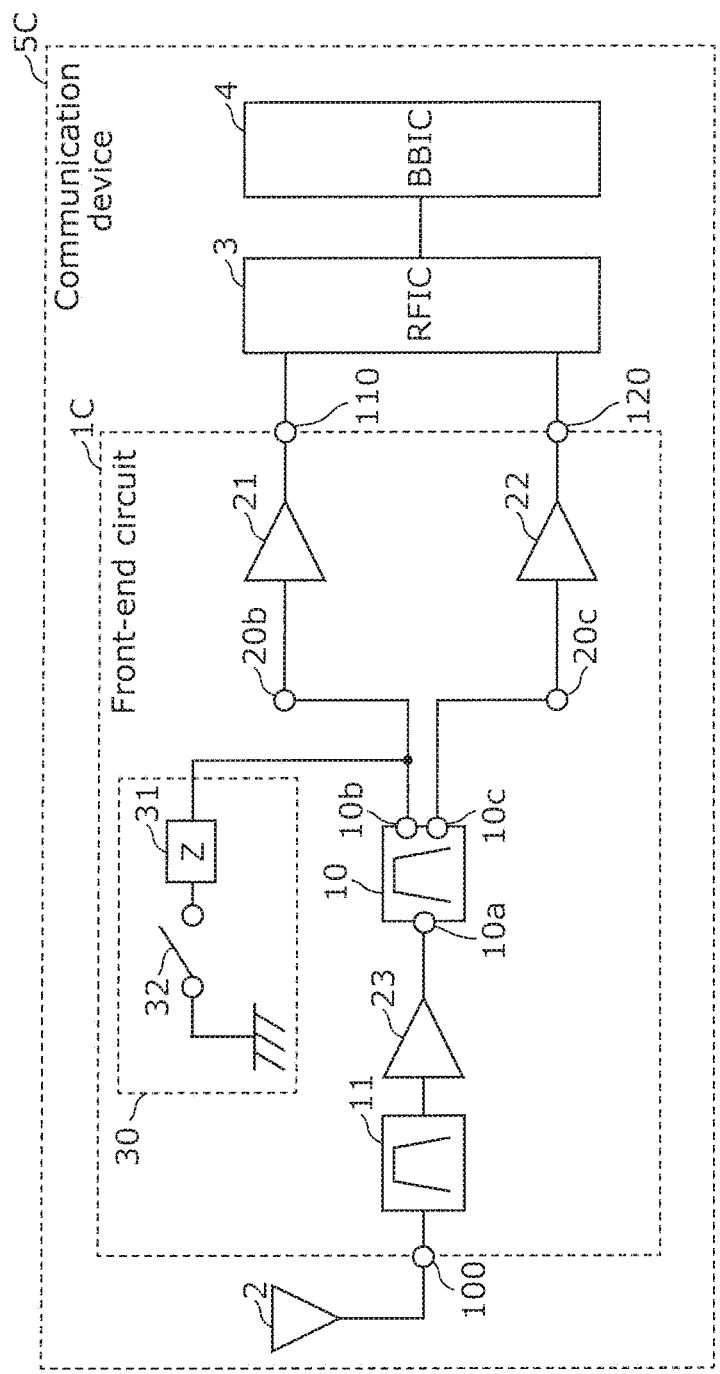
FIG. 8 is a circuit configuration diagram illustrating a front-end circuit and a communication device according to Variation 3 of Embodiment 1.

FIG. 8 is a circuit configuration diagram illustrating front-end circuit 1C and communication device 5C according to Variation 3 of Embodiment 1. As illustrated in FIG. 8, communication device 5C includes front-end circuit 1C, antenna 2, RFIC 3, and BBIC 4. Communication device 5C according to the present variation differs from communication device 5A according to Variation 1 of Embodiment 1 only in the configuration of front-end circuit 1C. Front-end circuit 1C according to the present variation differs from front-end circuit 1A according to Variation 1 of Embodiment 1 in that impedance-tunable circuit 30 is added. In what follows, a description of similarities in configuration between front-end circuit 1C and communication device 5C according to the present variation and front-end circuit 1A and communication device 5A according to Variation 1 of Embodiment 1 is omitted, and differences in configuration therebetween are mainly described.

Front-end circuit 1C includes filters 10 and 11, low-noise amplifiers 21, 22, and 23, and impedance-tunable circuit 30.

Impedance-tunable circuit 30 is connected to output terminal 10b of filter 10. Impedance-tunable circuit 30 includes impedance element 31 and switch 32 connected to impedance element 31. Impedance element 31 is, for example, at least one of an inductor or a capacitor.

Switch 32 is switched between a conducting state and a non-conducting state in accordance with, for example, at least one of (1) a frequency (communication band) of a radio frequency signal transferred through front-end circuit 1C, (2) a change of the receiving sensitivity of front-end circuit 1C, or (3) a change of the antenna sensitivity of antenna 2.

Terminal 20b is a node on a path connecting output terminal 10b and an input end of low-noise amplifier 21, and terminal 20c is a node on a path connecting output terminal 10c and an input end of low-noise amplifier 22.

Figure 9:
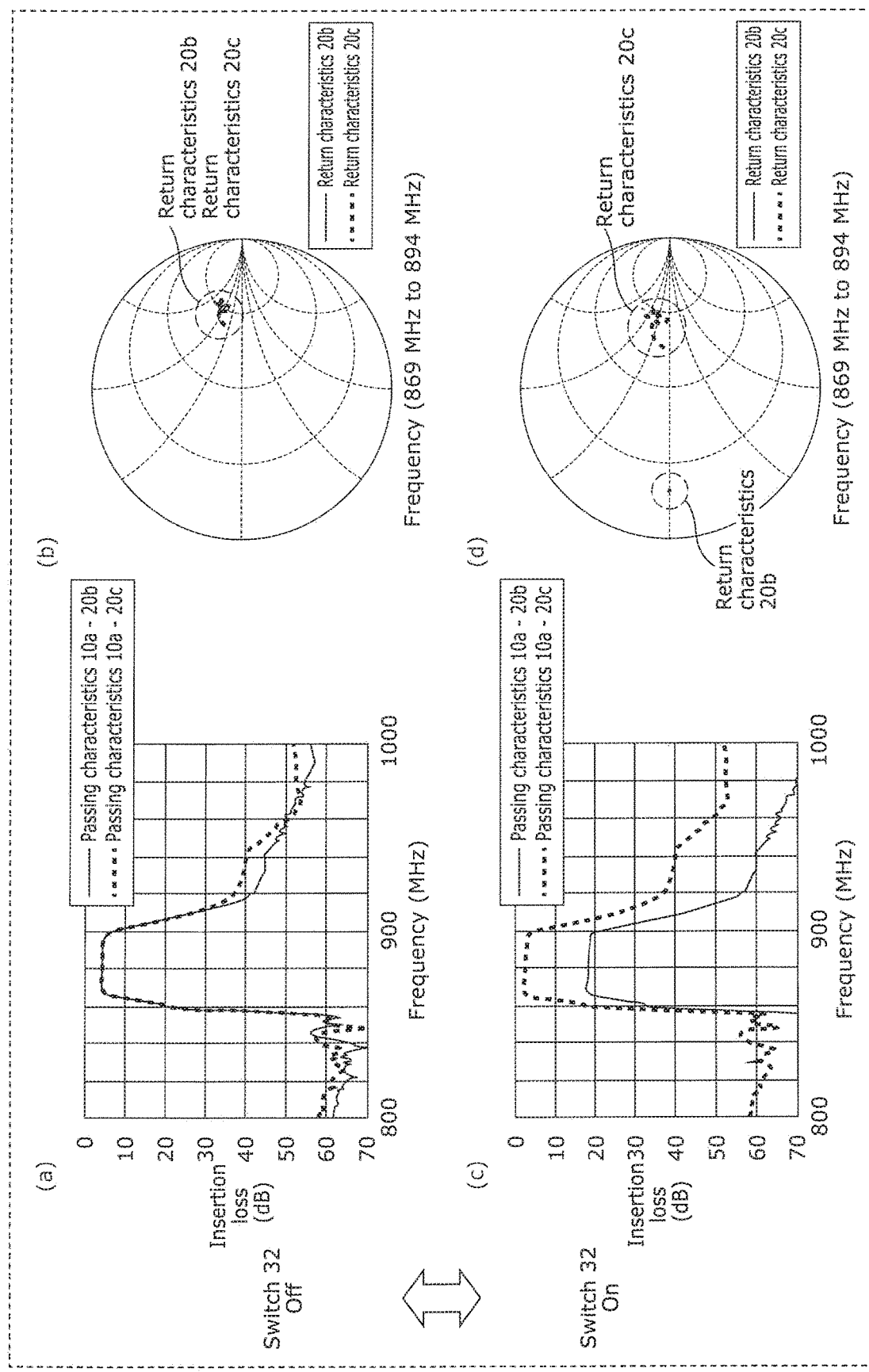
FIG. 9 is a diagram illustrating passing characteristics and return characteristics when a switch is conductive and non-conductive in the front-end circuit according to Variation 3 of Embodiment 1.

FIG. 9 is a diagram illustrating passing characteristics and return characteristics when switch 32 is conductive and non-conductive in front-end circuit 1C according to Variation 3 of Embodiment 1. FIG. 9 illustrates passing characteristics of filter 10 (passing characteristics between input terminal 10a and terminal 20b, passing characteristics between input terminal 10a and terminal 20c) when switch 32 is non-conductive (as shown in the upper-left); return characteristics of filter 10 (impedance characteristics of filter 10 seen from terminals 20b and 20c) when switch 32 is non-conductive (as shown in the upper-right); passing characteristics of filter 10 (passing characteristics between input terminal 10a and terminal 20b, passing characteristics between input terminal 10a and terminal 20c) when switch 32 is conductive (as shown in the bottom-left); and return characteristics of filter 10 (impedance characteristics of filter 10 seen from terminals 20b and 20c) when switch 32 is conductive (as shown in the bottom-right).

When both the first radio frequency signal outputted from output terminal 10b and the second radio frequency signal outputted from output terminal 10c are simultaneously transferred, as illustrated in FIG. 9, by making switch 32 non-conductive, it is possible to cause both the passing characteristics between input terminal 10a and terminal 20b and the passing characteristics between input terminal 10a and terminal 20c to be favorable (low-loss). Moreover, as further illustrated in FIG. 9, a variation in impedance of filter 10 seen from terminals 20b and 20c is small (a degree of concentration of a spiral is high). This causes an impedance match between filter 10 and low-noise amplifiers 21 and 22 disposed downstream to be favorable. Accordingly, it is possible to simultaneously transfer the first radio frequency signal outputted from output terminal 10b and the second radio frequency signal outputted from output terminal 10c at high quality.

When the first radio frequency signal outputted from output terminal 10b is not transferred, and only the second radio frequency signal outputted from output terminal 10c is transferred, as illustrated in FIG. 9, by making switch 32 conductive, it is possible to cause the passing characteristics between input terminal 10a and terminal 20b to deteriorate (greatly attenuate), and cause the passing characteristics between input terminal 10a and terminal 20c to be favorable (low-loss). Moreover, as further illustrated in FIG. 9, a variation in impedance of filter 10 seen from terminals 20b and 20c is small (a degree of concentration of a spiral is high). Further, the impedance of filter 10 seen from terminal 20b is shifted to a short side of the Smith chart. This causes an impedance match between filter 10 and low-noise amplifier 22 disposed downstream to be favorable. Accordingly, it is possible to transfer the second radio frequency signal outputted from output terminal 10c at high quality.

From the foregoing, it is possible to optimize the impedance match between filter 10 and low-noise amplifiers 21 and 22 in accordance with the selection of a radio frequency signal to be transferred. Accordingly, it is possible to improve the receiving sensitivity of front-end circuit 1C and communication device 5C.

It should be noted that impedance-tunable circuit 30 may be connected to output terminal 10c or input terminal 10a.

Embodiment 2

The present embodiment illustrates a front-end circuit formed by combining the front-end circuits according to Embodiment 1 and the variations thereof.

[2.1 Configurations of Front-end Circuit 1D and Communication Device 5D]

Figure 10:
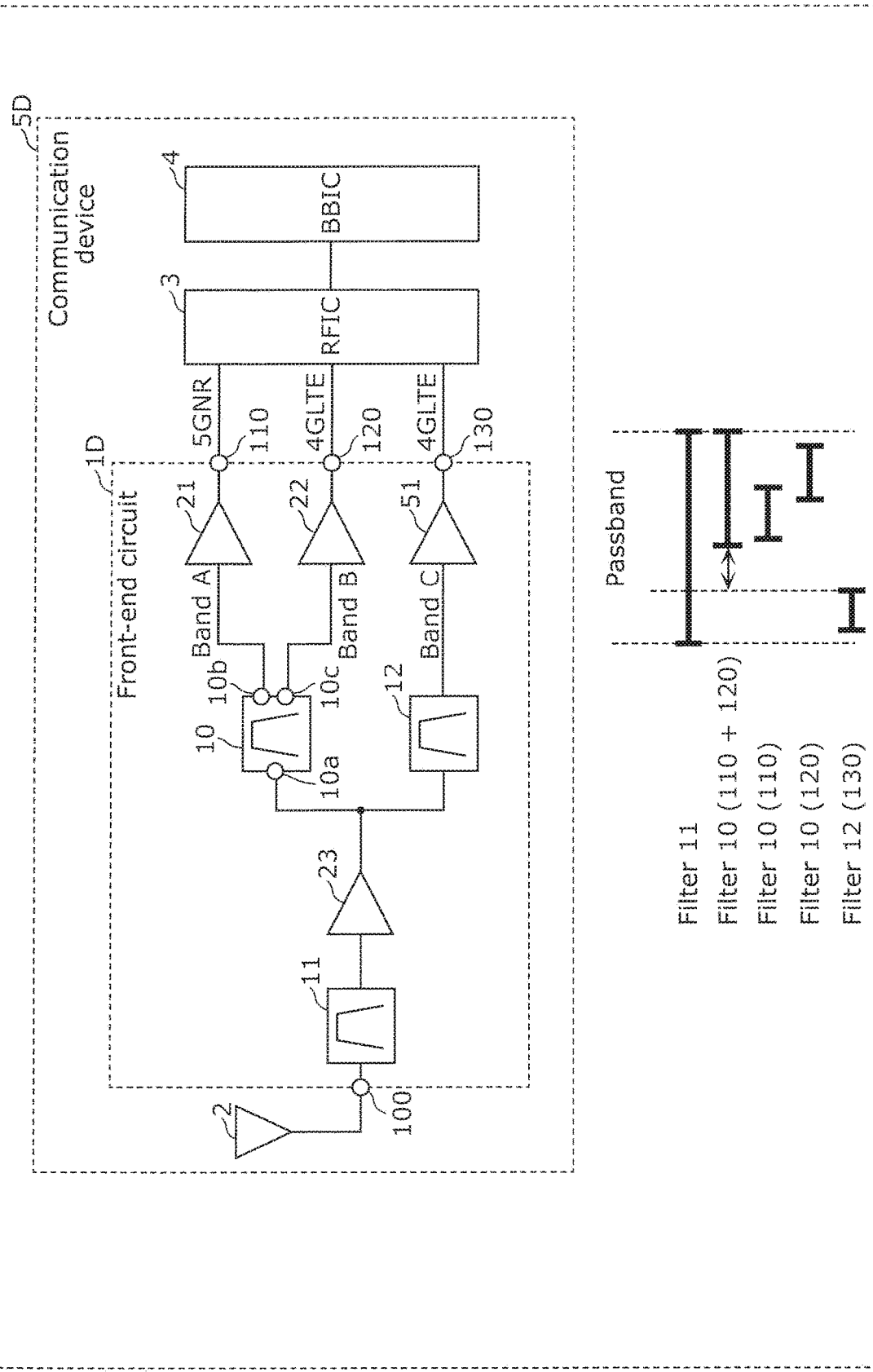
FIG. 10 is a circuit configuration diagram illustrating a front-end circuit and a communication device according to Embodiment 2.

FIG. 10 is a circuit configuration diagram illustrating front-end circuit 1D and communication device 5D according to Embodiment 2. As illustrated in FIG. 10, communication device 5D includes front-end circuit 1D, antenna 2, RFIC 3, and BBIC 4. Communication device 5D according to the present embodiment differs from communication device 5A according to Variation 1 of Embodiment 1 only in the configuration of front-end circuit 1D. Front-end circuit 1D according to the present embodiment differs from front-end circuit 1A according to Variation 1 of Embodiment 1 in that filter 12 and low-noise amplifier 51 are added. In what follows, a description of similarities in configuration between front-end circuit 1D and communication device 5D according to the present embodiment and front-end circuit 1A and communication device 5A according to Variation 1 of Embodiment 1 is omitted, and differences in configuration therebetween are mainly described.

Front-end circuit 1D includes filters 10, 11, and 12, and low-noise amplifiers 21, 22, 23, and 51.

Filter 10 has a first passband between input terminal 10a and output terminal 10b, and has a second passband between input terminal 10a and output terminal 10c. The first passband corresponds to, for example, Band A (communication band A) of 5G NR, and the second passband corresponds to, for example, Band B (communication band B) of 4G LTE.

Low-noise amplifier 21 is an example of the first low-noise amplifier, is connected to output terminal 10b, and amplifies the first radio frequency signal in the first passband outputted from output terminal 10b.

Low-noise amplifier 22 is an example of the second low-noise amplifier, is connected to output terminal 10c, and amplifies the second radio frequency signal in the second passband outputted from output terminal 10c.

Filter 12 is an example of a fifth filter, includes a third input terminal and a fifth output terminal that are unbalanced, and has a fifth passband having a frequency range that does not overlap frequency ranges of the first passband and the second passband of filter 10. The third input terminal is connected to input terminal 10a. The fifth passband corresponds to, for example, Band C (communication band C) of 4G LTE. It should be noted that the fifth passband may correspond to communication band C of 5G NR.

Low-noise amplifier 51 is an example of a seventh low-noise amplifier, is connected to the fifth output terminal, and amplifies a radio frequency signal in the fifth passband outputted from filter 12.

Low-noise amplifier 51 is configured as, for example, a silicon (Si) complementary metal oxide semiconductor (CMOS), a Gallium Arsenide (GaAs) field-effect transistor (FET), or a hetero bipolar transistor (HBT).

The above configurations of front-end circuit 1D and communication device 5D according to the present embodiment make it possible to simultaneously transfer a radio frequency signal in Band A of 5G NR and a radio frequency signal in Band B of 4G LTE at high quality, and simultaneously transfer, together with these radio frequency signals, a radio frequency signal in Band C of 4G LTE while reducing mutual interference between the radio frequency signals.

[2.2 Configurations of Front-end Circuit 1E and Communication Device 5E According to Variation 1]

Figure 11:
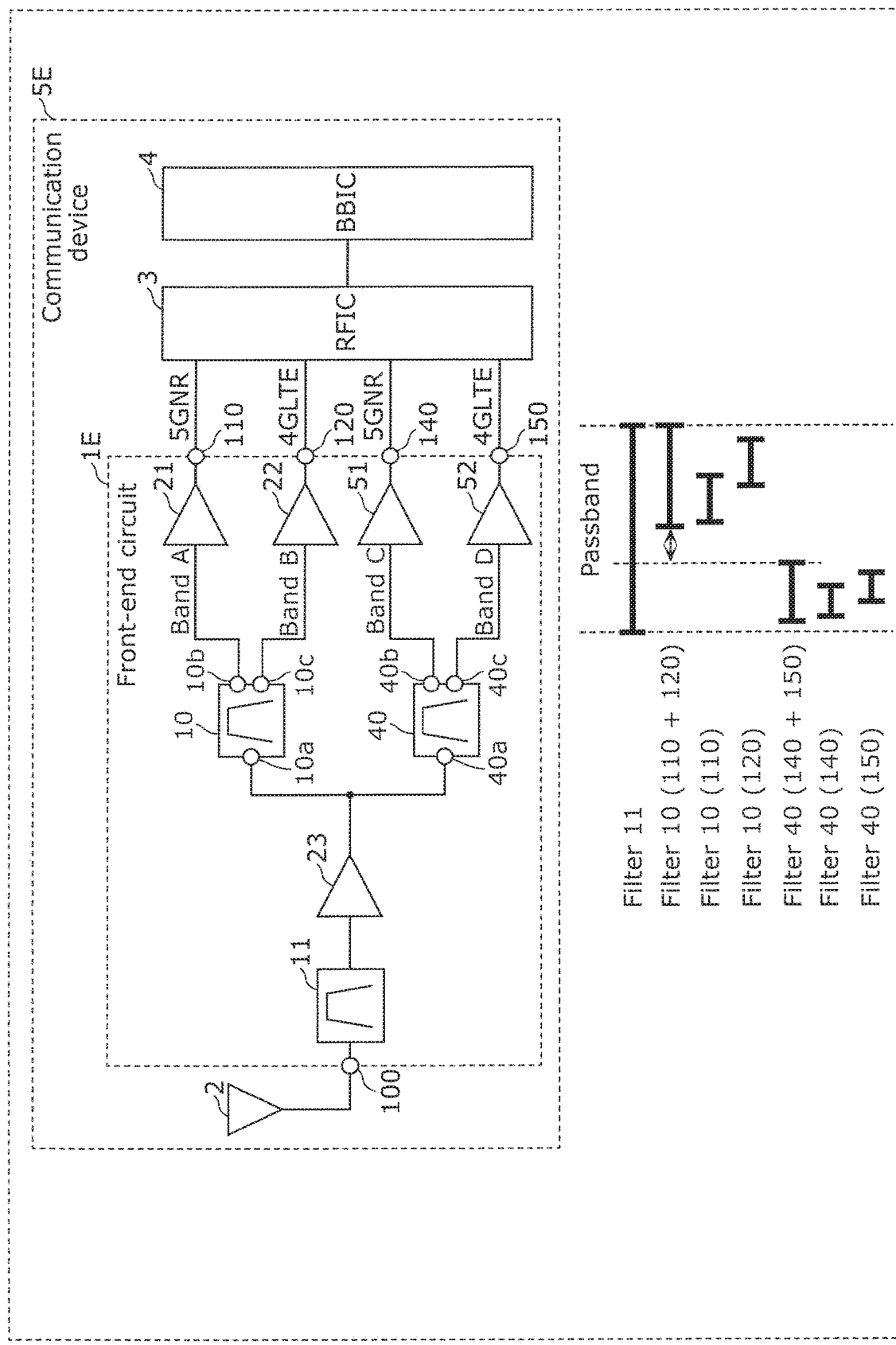
FIG. 11 is a circuit configuration diagram illustrating a front-end circuit and a communication device according to Variation 1 of Embodiment 2.

FIG. 11 is a circuit configuration diagram illustrating front-end circuit 1E and communication device 5E according to Variation 1 of Embodiment 2. As illustrated in FIG. 11, communication device 5E includes front-end circuit 1E, antenna 2, RFIC 3, and BBIC 4. Communication device 5E according to the present variation differs from communication device 5A according to Variation 1 of Embodiment 1 only in the configuration of front-end circuit 1E. Front-end circuit 1E according to the present variation differs from front-end circuit 1A according to Variation 1 of Embodiment 1 in that filter 40 and low-noise amplifiers 51 and 52 are added. In what follows, a description of similarities in configuration between front-end circuit 1E and communication device 5E according to the present variation and front-end circuit 1A and communication device 5A according to Variation 1 of Embodiment 1 is omitted, and differences in configuration therebetween are mainly described.

Front-end circuit 1E includes filters 10, 11, and 40, and low-noise amplifiers 21, 22, 23, 51, and 52.

Filter 10 has a first passband between input terminal 10a and output terminal 10b, and has a second passband between input terminal 10a and output terminal 10c. The first passband corresponds to, for example, Band A (communication band A) of 5G NR, and the second passband corresponds to, for example, Band B (communication band B) of 4G LTE.

Filter 40 is an example of a sixth filter, and includes input terminal 40a (fourth input terminal), output terminal 40b (sixth output terminal), and output terminal 40c (seventh output terminal). Filter 40 converts an unbalanced radio frequency signal inputted to input terminal 40a into two balanced radio frequency signals, and outputs one of the two balanced radio frequency signals from output terminal 40b and the other of the two balanced radio frequency signals from output terminal 40c. It should be noted that the one of the two balanced radio frequency signals outputted from output terminal 40b is inputted as a third radio frequency signal that is unbalanced, to low-noise amplifier 51. Further, the other of the two balanced radio frequency signals outputted from output terminal 40c is inputted as a fourth radio frequency signal that is unbalanced, to low-noise amplifier 52. As a result, the third radio frequency signal and the fourth radio frequency signal are in antiphase.

Filter 40 has an eighth passband between input terminal 40a and output terminal 40b, and has a ninth passband between input terminal 10a and output terminal 10c. The eighth passband corresponds to, for example, Band C (communication band C) of 5G NR, and the ninth passband corresponds to, for example, Band D (communication band D) of 4G LTE. In other words, the third radio frequency signal mainly contains frequency components in Band C (the eighth passband), and the fourth radio frequency signal mainly contains frequency components in Band D (the ninth passband). Filter 40 may be, for example, any of an acoustic wave filter that uses SAWs, an acoustic wave filter that uses BAWs, an LC resonant filter, an LC resonant circuit including an acoustic wave resonator, and a dielectric filter. Further, filter 40 is not limited to these. When filter 40 is an acoustic wave filter that uses SAWs, filter 40 achieves unbalanced input and balanced output by including a vertically coupled surface acoustic wave filter.

Input terminal 40a is connected to input terminal 10a.

Low-noise amplifier 21 is an example of the first low-noise amplifier, is connected to output terminal 10b, and amplifies the first radio frequency signal in the first passband outputted from output terminal 10b.

Low-noise amplifier 22 is an example of the second low-noise amplifier, is connected to output terminal 10c, and amplifies the second radio frequency signal in the second passband outputted from output terminal 10c.

Low-noise amplifier 51 is an example of an eighth low-noise amplifier, is connected to output terminal 40b, and amplifies the third radio frequency signal in the eighth passband outputted from output terminal 40b.

Low-noise amplifier 52 is an example of a ninth low-noise amplifier, is connected to output terminal 40c, and amplifies the fourth radio frequency signal in the ninth passband outputted from output terminal 40c.

Low-noise amplifiers 51 and 52 are each configured as, for example, a silicon (Si) complementary metal oxide semiconductor (CMOS), a Gallium Arsenide (GaAs) field-effect transistor (FET), or a hetero bipolar transistor (HBT).

The eighth passband and the ninth passband of filter 40 have frequency ranges that do not overlap frequency ranges of the first passband and the second passband of filter 10.

A passband of filter 11 encompasses the first passband, the second passband, the eighth passband, and the ninth passband.

The above configurations of front-end circuit 1E and communication device 5E according to the present variation make it possible to simultaneously transfer the first radio frequency signal and the second radio frequency signal having passed through filter 10 while reducing mutual interference between the first radio frequency signal and the second radio frequency signal. Moreover, the configurations make it possible to simultaneously transfer the third radio frequency signal and the fourth radio frequency signal having passed through filter 40 while reducing mutual interference between the third radio frequency signal and the fourth radio frequency signal.

Furthermore, the above configurations make it possible to achieve (1) EN-DC by two bands of communication band A (5G NR) and communication band B (4G LTE), (2) EN-DC by two bands of communication band C (5G NR) and communication band D 4G LTE), and (3) EN-DC by four bands of communication band A (5G NR), communication band C (5G NR), communication band B (4G LTE), and communication band D (4G LTE). Consequently, it is possible to increase options for communication bands when EN-DC is performed.

It should be noted that in the case of above (1), low-noise amplifiers 51 and 52 may be turned OFF. With this, in the case of above (1), it is possible to reduce impact on communication band A and communication band B for performing EN-DC. Further, in the case of above (2), low-noise amplifiers 21 and 22 may be turned OFF. With this, in the case of above (2), it is possible to reduce impact on communication band C and communication band D for performing EN-DC.

[2.3 Configurations of Front-end Circuit 1F and Communication Device 5F According to Variation 2]

Figure 12:
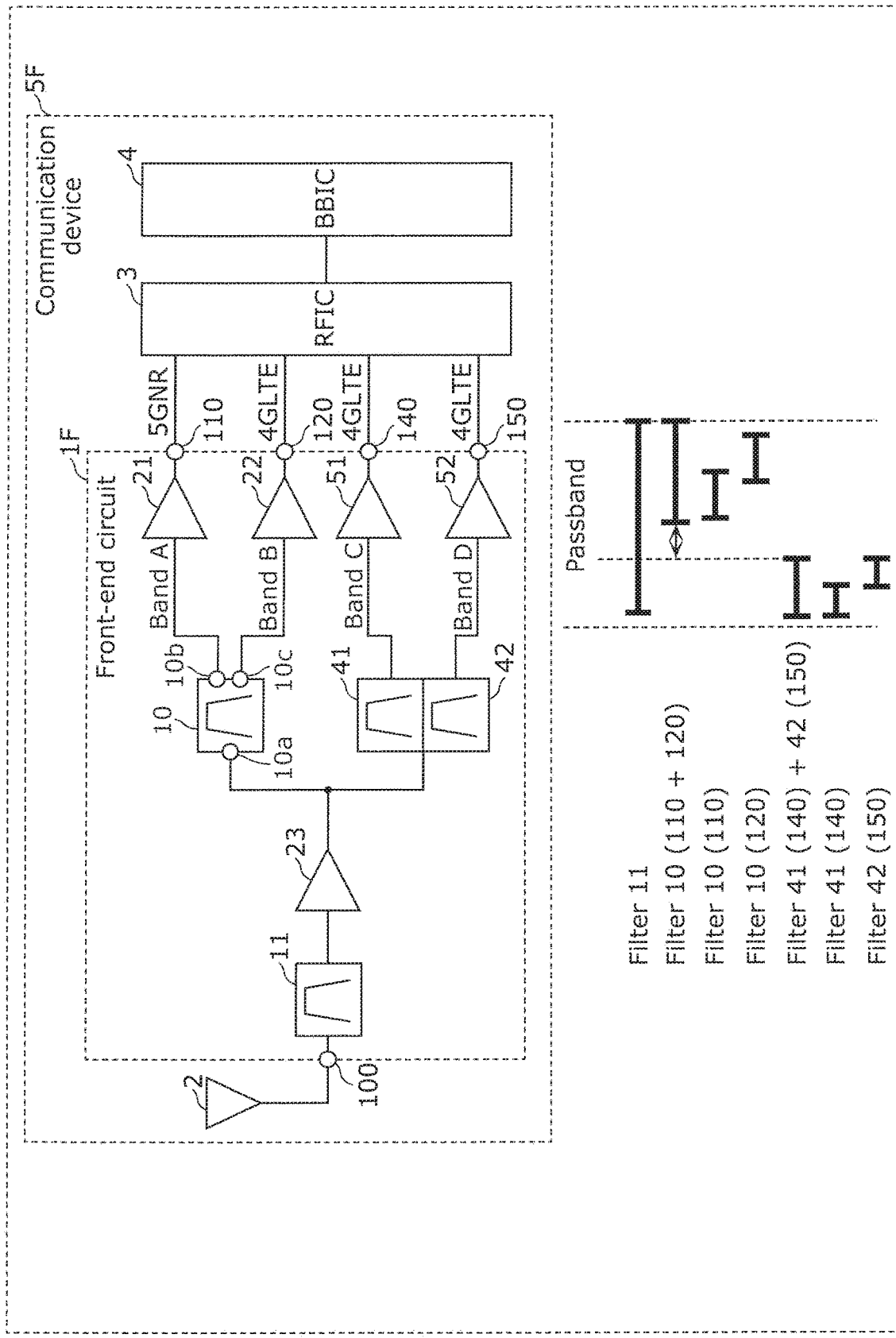
FIG. 12 is a circuit configuration diagram illustrating a front-end circuit and a communication device according to Variation 2 of Embodiment 2.

FIG. 12 is a circuit configuration diagram illustrating front-end circuit 1F and communication device 5F according to Variation 2 of Embodiment 2. As illustrated in FIG. 12, communication device 5F includes front-end circuit 1F, antenna 2, RFIC 3, and BBIC 4. Communication device 5F according to the present variation differs from communication device 5A according to Variation 1 of Embodiment 1 only in the configuration of front-end circuit 1F. Front-end circuit 1F according to the present variation differs from front-end circuit 1A according to Variation 1 of Embodiment 1 in that filters 41 and 42 and low-noise amplifiers 51 and 52 are added. In what follows, a description of similarities in configuration between front-end circuit 1F and communication device 5F according to the present variation and front-end circuit 1A and communication device 5A according to Variation 1 of Embodiment 1 is omitted, and differences in configuration therebetween are mainly described.

Front-end circuit 1F includes filters 10, 11, 41, and 42, and low-noise amplifiers 21, 22, 23, 51, and 52.

Filter 10 has a first passband between input terminal 10a and output terminal 10b, and has a second passband between input terminal 10a and output terminal 10c. The first passband corresponds to, for example, Band A (communication band A) of 5G NR, and the second passband corresponds to, for example, Band B (communication band B) of 4G LTE.

Filter 41 is an example of a seventh filter, includes a fifth input terminal and an eighth output terminal that are unbalanced, and has a sixth passband having a frequency range that does not overlap frequency ranges of the first passband and the second passband of filter 10. Filter 42 is an example of an eighth filter, includes the fifth input terminal and a ninth output terminal that are unbalanced, and has a seventh passband having a frequency range that does not overlap the frequency ranges of the first passband and the second passband of filter 10 and the frequency range of the sixth passband. Filters 41 and 42 constitute a diplexer. The sixth passband corresponds to, for example, Band C (communication band C) of 4G LTE, and the seventh passband corresponds to, for example, Band D (communication band D) of 4G LTE.

A common input terminal (the fifth input terminal) of above filters 41 and 42 is connected to input terminal 10*a*.

Low-noise amplifier 21 is an example of the first low-noise amplifier, is connected to output terminal 10*b*, and amplifies the first radio frequency signal in the first passband outputted from output terminal 10*b*.

Low-noise amplifier 22 is an example of the second low-noise amplifier, is connected to output terminal 10*c*, and amplifies the second radio frequency signal in the second passband outputted from output terminal 10*c*.

Low-noise amplifier 51 is an example of a tenth low-noise amplifier, is connected to the eighth output terminal, and amplifies a fifth radio frequency signal in the sixth passband outputted from the eighth output terminal.

Low-noise amplifier 52 is an example of an eleventh low-noise amplifier, is connected to the ninth output terminal, and amplifies a sixth radio frequency signal in the seventh passband outputted from the ninth output terminal.

Low-noise amplifiers 51 and 52 are each configured as, for example, a silicon (Si) complementary metal oxide semiconductor (CMOS), a Gallium Arsenide (GaAs) field-effect transistor (FET), or a hetero bipolar transistor (HBT).

The sixth passband of filter 41 and the seventh passband of filter 42 have frequency ranges that do not overlap frequency ranges of the first passband and the second passband of filter 10.

A passband of filter 11 encompasses the first passband, the second passband, the sixth passband, and the seventh passband.

The above configurations of front-end circuit 1F and communication device 5F according to the present variation make it possible to simultaneously transfer the first radio frequency signal and the second radio frequency signal having passed through filter 10 while reducing mutual interference between the first radio frequency signal and the second radio frequency signal. Moreover, the configurations make it possible to perform simultaneous transfer (CA) of the fifth radio frequency signal having passed through filter 41 and the sixth radio frequency signal having passed through filter 42.

Furthermore, the above configurations make it possible to achieve (1) EN-DC by two bands of communication band A (5G NR) and communication band B (4G LTE), (2) CA by two bands of communication band C (4G LTE) and communication band D (4G LTE), and (3) EN-DC and CA by four bands of communication band A (5G NR), communication band B (4G LTE), communication band C (4G LTE), and communication band D (4G LTE). As a result, it is possible to increase options for communication bands to be simultaneously used.

It should be noted that in the case of above (1), low-noise amplifiers 51 and 52 may be turned OFF. With this, in the case of above (1), even when a CA transfer circuit is connected, it is possible to reduce impact on communication band A and communication band B for performing EN-DC. Further, in the case of above (2), low-noise amplifiers 21 and 22 may be turned OFF. With this, in the case of above (2), even when an EN-DC transfer circuit is connected, it is possible to reduce impact on communication band C and communication band D for performing CA.

It should be noted that instead of filters 41 and 42, at least three filters having mutually non-overlapping passbands may be connected to input terminal 10*a*. In other words, communication bands for performing CA in 4G are not limited to Band C and Band D, and a configuration capable of performing CA in at least three communication bands of 4G LTE may be used.

[2.4 Configurations of Front-end Circuit 1G and Communication Device 5G According to Variation 3]

Figure 13:
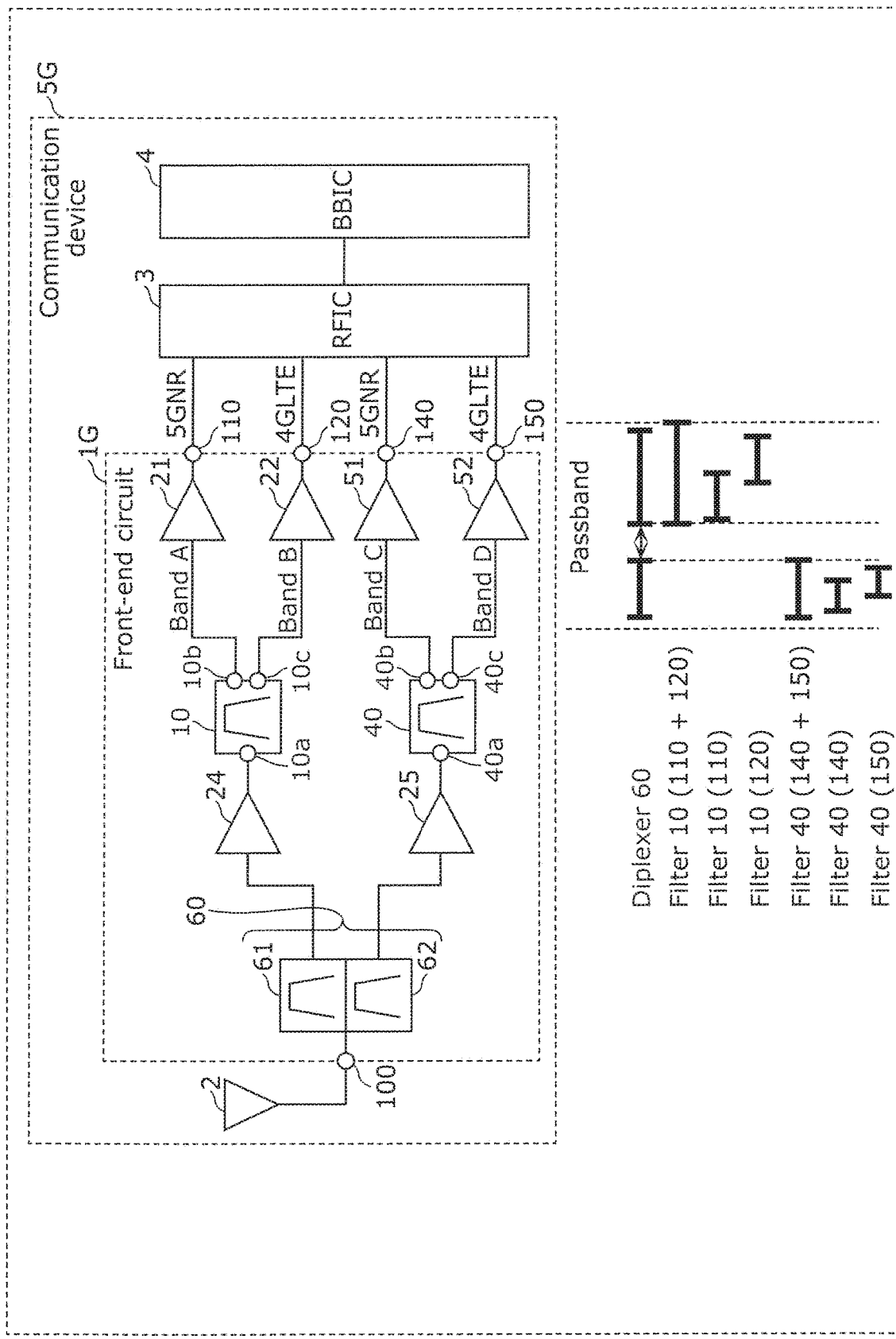
FIG. 13 is a circuit configuration diagram illustrating a front-end circuit and a communication device according to Variation 3 of Embodiment 2.

FIG. 13 is a circuit configuration diagram illustrating front-end circuit 1G and communication device 5G according to Variation 3 of Embodiment 2. As illustrated in FIG. 13, communication device 5G includes front-end circuit 1G, antenna 2, RFIC 3, and BBIC 4. Communication device 5G according to the present variation differs from communication device 5A according to Variation 1 of Embodiment 1 only in the configuration of front-end circuit 1G. Front-end circuit 1G according to the present variation differs from front-end circuit 1A according to Variation 1 of Embodiment 1 in including two front-end circuits 1A. In what follows, a description of similarities in configuration between front-end circuit 1G and communication device 5G according to the present variation and front-end circuit 1A and communication device 5A according to Variation 1 of Embodiment 1 is omitted, and differences in configuration therebetween are mainly described.

Front-end circuit 1G includes filters 10 and 40, low-noise amplifiers 21, 22, 24, 25, 51, and 52, diplexer 60, and antenna terminal 100.

Antenna terminal 100 is connected to antenna 2.

Diplexer 60 includes filters 61 and 62. Filter 61 is an example of the second filter, and has a third passband. The third passband encompasses the first passband and the second passband of filter 10. Filter 62 is an example of a third filter, and has a fourth passband that does not overlap the third passband. The fourth passband encompasses the eighth passband and the ninth passband of filter 40. Filters 61 and 62 each have an input end connected to antenna terminal 100. It should be noted that diplexer 60 may be a triplexer or a multiplexer including at least three filters having mutually non-overlapping passbands.

In other words, front-end circuit 1G has a configuration in which two front-end circuits 1A according to Variation 1 of Embodiment 1 are connected to diplexer 60. This configuration makes it possible to simultaneously transfer the first radio frequency signal and the second radio frequency signal having passed through filter 10, and simultaneously transfer a radio frequency signal having passed through filter 62 and having a frequency range different from frequency ranges of the radio frequency signals having passed through filter 10.

Low-noise amplifier 24 is an example of the third low-noise amplifier, and amplifies a radio frequency signal in the third passband outputted from filter 61. Low-noise amplifier 24 has an output end connected to input terminal 10*a* of filter 10, and an input end connected to an output end of filter 61.

Filter 40 is an example of a fourth filter, and includes input terminal 40*a* (second input terminal), output terminal 40*b* (third output terminal), and output terminal 40*c* (fourth output terminal). Filter 40 converts an unbalanced radio frequency signal inputted to input terminal 40*a* into two balanced radio frequency signals, and outputs one of the two balanced radio frequency signals from output terminal 40*b* and the other of the two balanced radio frequency signals from output terminal 40*c*. It should be noted that the one of the two balanced radio frequency signals outputted from output terminal 40*b* is inputted as a third radio frequency signal that is unbalanced, to low-noise amplifier 51. Further, the other of the two balanced radio frequency signals outputted from output terminal 40c is inputted as a fourth radio frequency signal that is unbalanced, to low-noise amplifier 52. As a result, the third radio frequency signal and the fourth radio frequency signal are in antiphase.

Filter 40 has an eighth passband between input terminal 40a and output terminal 40b, and has a ninth passband between input terminal 40a and output terminal 40c. The eighth passband corresponds to, for example, Band C (communication band C) of 5G NR, and the ninth passband corresponds to, for example, Band D (communication band D) of 4G LTE. In other words, the third radio frequency signal mainly contains frequency components in Band C (the eighth passband), and the fourth radio frequency signal mainly contains frequency components in Band D (the ninth passband). Filter 40 may be, for example, any of an acoustic wave filter that uses SAWs, an acoustic wave filter that uses BAWs, an LC resonant filter, an LC resonant circuit including an acoustic wave resonator, and a dielectric filter. Further, filter 40 is not limited to these. When filter 40 is an acoustic wave filter that uses SAWs, filter 40 achieves unbalanced input and balanced output by including a vertically coupled surface acoustic wave filter.

Low-noise amplifier 51 is an example of a fifth low-noise amplifier, is connected to output terminal 40b, and amplifies the third radio frequency signal in the eighth passband outputted from output terminal 40b.

Low-noise amplifier 52 is an example of a sixth low-noise amplifier, is connected to output terminal 40c, and amplifies the fourth radio frequency signal in the ninth passband outputted from output terminal 40c.

Low-noise amplifier 25 is an example of a fourth low-noise amplifier, and amplifies a radio frequency signal in the fourth passband outputted from filter 62. Low-noise amplifier 25 has an output end connected to input terminal 40a of filter 40, and an input end connected to an output end of filter 62.

Low-noise amplifiers 25, 51, and 52 are each configured as, for example, a silicon (Si) complementary metal oxide semiconductor (CMOS), a Gallium Arsenide (GaAs) field-effect transistor (FET), or a hetero bipolar transistor (HBT).

The fourth passband of filter 62 has a frequency range that does not overlap a frequency range of the third passband of filter 61.

The above configurations of front-end circuit 1G and communication device 5G according to the present variation make it possible to simultaneously transfer the first radio frequency signal and the second radio frequency signal having passed through filter 10 while reducing mutual interference between the first radio frequency signal and the second radio frequency signal. Moreover, the configurations make it possible to simultaneously transfer the third radio frequency signal and the fourth radio frequency signal having passed through filter 40 while reducing mutual interference between the third radio frequency signal and the fourth radio frequency signal.

Furthermore, the above configurations make it possible to achieve (1) EN-DC by two bands of communication band A (5G NR) and communication band B (4G LTE), (2) EN-DC by two bands of communication band C (5G NR) and communication band D 4G LTE), and (3) EN-DC by four bands of communication band A (5G NR), communication band C (5G NR), communication band B (4G LTE), and communication band D (4G LTE). Consequently, it is possible to increase options for communication bands when EN-DC is performed.

It should be noted that in the case of above (1), low-noise amplifiers 51 and 52 may be turned OFF. With this, in the case of above (1), it is possible to reduce impact on communication band A and communication band B for performing EN-DC. Further, in the case of above (2), low-noise amplifiers 21 and 22 may be turned OFF. With this, in the case of above (2), it is possible to reduce impact on communication band C and communication band D for performing EN-DC.

[2.5 Configurations of Front-end Circuit 1H and Communication Device 5H According to Variation 4]

Figure 14:
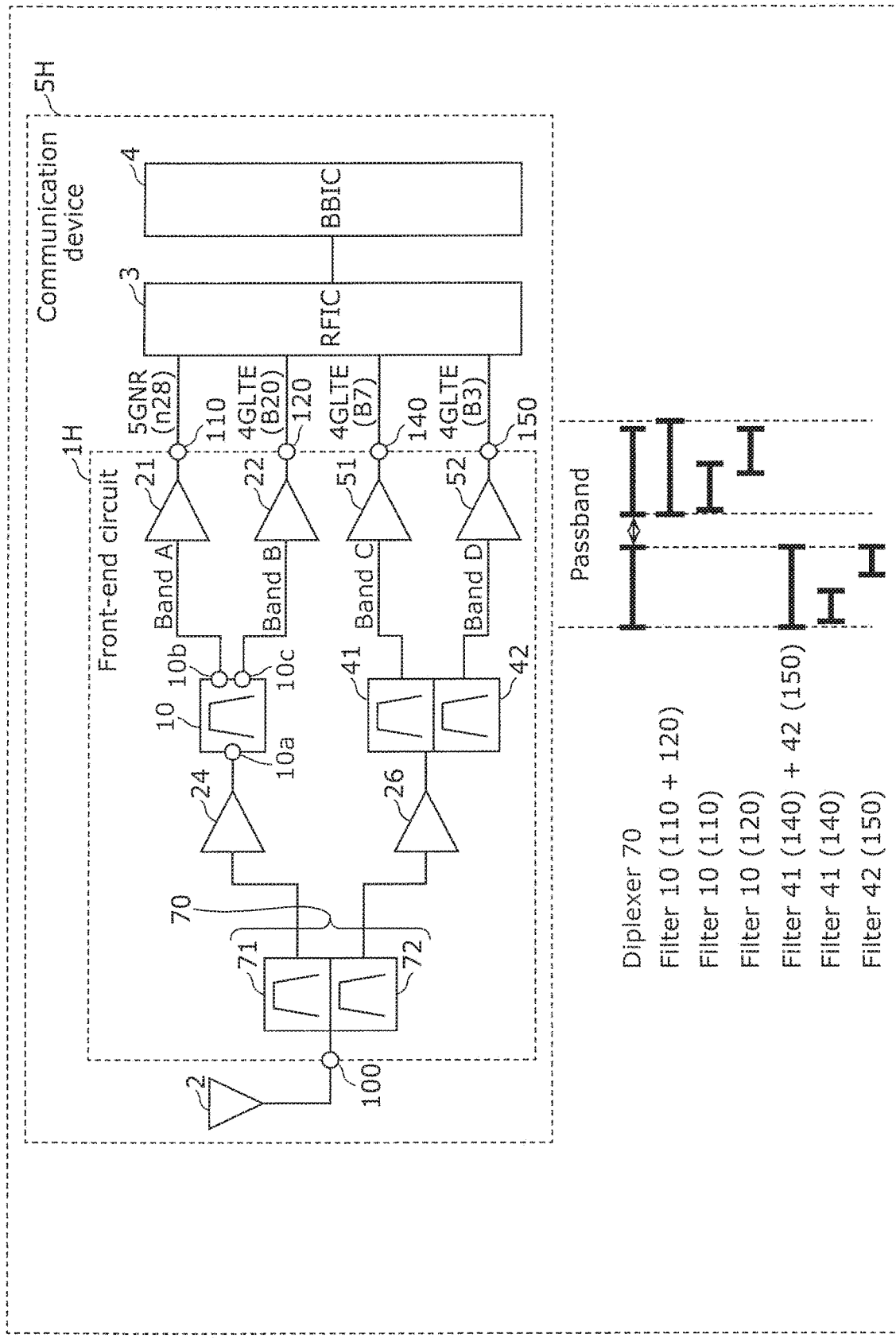
FIG. 14 is a circuit configuration diagram illustrating a front-end circuit and a communication device according to Variation 4 of Embodiment 2.

FIG. 14 is a circuit configuration diagram illustrating front-end circuit 1H and communication device 5H according to Variation 4 of Embodiment 2. As illustrated in FIG. 14, communication device 5H includes front-end circuit 1H, antenna 2, RFIC 3, and BBIC 4. Communication device 5H according to the present variation differs from communication device 5G according to Variation 3 of Embodiment 2 only in the configuration of front-end circuit 1H. Front-end circuit 1H according to the present variation differs from front-end circuit 1G according to Variation 3 of Embodiment 2 in that filters 41 and 42 are disposed in place of filter 40. In what follows, a description of similarities in configuration between front-end circuit 1H and communication device 5H according to the present variation and front-end circuit 1G and communication device 5G according to Variation 3 of Embodiment 2 is omitted, and differences in configuration therebetween are mainly described.

Front-end circuit 1H includes filters 10, 41, and 42, low-noise amplifiers 21, 22, 24, 26, 51, and 52, diplexer 70, and antenna terminal 100.

Antenna terminal 100 is connected to antenna 2.

Diplexer 70 includes filters 71 and 72. Filter 71 is an example of the second filter, and has a third passband. The third passband encompasses the first passband and the second passband of filter 10. Filter 72 is an example of the third filter, and has a fourth passband that does not overlap the third passband. The fourth passband encompasses a passband of filter 41 and a passband of filter 42. Filters 71 and 72 each have an input end connected to antenna terminal 100. It should be noted that diplexer 70 may be a triplexer or a multiplexer including at least three filters having mutually non-overlapping passbands.

Filter 41 includes an input terminal and an output terminal that are unbalanced, and has a sixth passband having a frequency range that does not overlap frequency ranges of the first passband and the second passband of filter 10. Filter 42 includes an input terminal and an output terminal that are unbalanced, and has a seventh passband having a frequency range that does not overlap the frequency ranges of the first passband and the second passband of filter 10 and the frequency range of the sixth passband of filter 41. Filters 41 and 42 constitute a diplexer.

Filters 41 and 42 have the input terminals connected to input terminal 10a of filter 10. In other words, a common input terminal (the fifth input terminal) of filters 41 and 42 is connected to input terminal 10a of filter 10.

The first passband corresponds to, for example, n 28 of 5G NR, and the second passband corresponds to, for example, Band 20 of 4G LTE. Further, the sixth passband corresponds to, for example, Band 7 (receiving band: 2620 to 2690 MHz) of 4G LTE, and the seventh passband corresponds to, for example, Band 3 (receiving band: 1805 to 1880 MHz) of 4G LTE.

Low-noise amplifier 51 is an example of the tenth low-noise amplifier, is connected to the output terminal of filter

41, and amplifies a fifth radio frequency signal in the sixth passband outputted from the output terminal.

Low-noise amplifier 52 is an example of the eleventh low-noise amplifier, is connected to the output terminal of filter 42, and amplifies a sixth radio frequency signal in the seventh passband outputted from the output terminal.

The sixth passband of filter 41 and the seventh passband of filter 42 have frequency ranges that do not overlap the frequency ranges of the first passband and the second passband of filter 10.

Low-noise amplifier 24 is an example of the third low-noise amplifier, and amplifies a radio frequency signal in the third passband outputted from filter 71. Low-noise amplifier 24 has an output end connected to input terminal 10a of filter 10, and an input end connected to an output end of filter 71.

Low-noise amplifier 26 is an example of the fourth low-noise amplifier, and amplifies a radio frequency signal in the fourth passband outputted from filter 72. Low-noise amplifier 26 has an output end connected to the input terminals of filters 41 and 42, and an input end connected to an output end of filter 72.

A passband of filter 11 encompasses the first passband, the second passband, the sixth passband, and the seventh passband.

The above configurations of front-end circuit 1H and communication device 5H according to the present variation make it possible to simultaneously transfer the first radio frequency signal and the second radio frequency signal having passed through filter 10 while reducing mutual interference between the first radio frequency signal and the second radio frequency signal. Moreover, the configurations make it possible to perform simultaneous transfer (CA) of the fifth radio frequency signal having passed through filter 41 and the sixth radio frequency signal having passed through filter 42.

Furthermore, the above configurations make it possible to achieve (1) EN-DC by two bands of communication band A (5G NR) and communication band B (4G LTE), (2) CA by two bands of communication band C (4G LTE) and communication band D (4G LTE), and (3) EN-DC and CA by four bands of communication band A (5G NR), communication band B (4G LTE), communication band C (4G LTE), and communication band D (4G LTE). As a result, it is possible to increase options for communication bands to be simultaneously used. It should be noted that in the case of above (2), low-noise amplifiers 21 and 22 may be turned OFF. With this, in the case of above (2), even when an EN-DC transfer circuit is connected, it is possible to reduce impact on communication band C and communication band D for performing CA.

It should be noted that in the case of above (1), low-noise amplifiers 51 and 52 may be turned OFF. With this, in the case of above (1), even when a CA transfer circuit is connected, it is possible to reduce impact on communication band A and communication band B for performing EN-DC. Further, in the case of above (2), low-noise amplifiers 21 and 22 may be turned OFF. With this, in the case of above (2), even when an EN-DC transfer circuit is connected, it is possible to reduce an impact on communication band C and communication band D for performing CA.

OTHER EMBODIMENTS

Although the front-end circuit and the communication device according to the present disclosure have been described above using the embodiments and the variations, the front-end circuit and the communication device according to the present disclosure are not limited to the above embodiments and variations. The present disclosure also contains other embodiments realized by combining any constituent elements in the above embodiments and variations, variations obtained by making various modifications to the above embodiments and variations that can be conceived by a person with an ordinary skill in the art without departing from the scope of the present disclosure, and various devices that include the front-end circuit and the communication device according to the above embodiments and variations.

It should be noted that, as stated above, the front-end circuit and the communication device according to the above embodiments and variations are used for a communication system such as a 3GPP system, and are used typically for a system that simultaneously transfers the 4G LTE radio frequency signal and the 5G NR radio frequency signal described in the embodiments. Examples of a combination of 4G LTE and 5G NR include (1) Band 41 and n 41, (2) Band 5 and n 5, (3) Band 71 and n 71, and (4) Band 3 and n 3.

Moreover, the front-end circuit and the communication device according to the above embodiments and variations are also used for a communication system that is not a 3GPP system. Examples of a combination of a signal in Band A passing through the first filter and a signal in Band B passing through the second filter include (1) a wireless local area network (WLAN) and a 4G-LTE unlicensed band, (2) WLAN and a 5G-NR unlicensed band (5G-NR-U), and (3) a licensed band and an unlicensed band. In above (3), that a communication system for the licensed band and a communication system for the unlicensed band are different means that output regulations for transmission power are different, for example. Further, in above (1) to (3) can be used for communication schemes where different communication systems simultaneously transmit two different signals include carrier sense.

In other words, the front-end circuit and the communication device according to the above embodiments and variations can be used for any communication system and any communication band, and can be also used for a millimeter band.

Furthermore, for example, in the front-end circuit and the communication device according to the above embodiments and variations, another radio frequency circuit element, a wire, etc. may be disposed between paths connecting the circuit elements and the signal paths illustrated in the figures.

Moreover, although the front-end circuit and the communication device according to the above embodiments and variations are a receiver circuit that transfers a radio frequency signal received by antenna 2, the front-end circuit and the communication device according to the above embodiments and variations are also used as a transmission circuit that transfers a radio frequency signal generated by RFIC 3 and transmits the radio frequency signal from antenna 2. In this case, for example, in front-end circuit 1 and communication device 5 illustrated in FIG. 1, power amplifiers are disposed in place of low-noise amplifiers 21 and 22.

Figure 15:
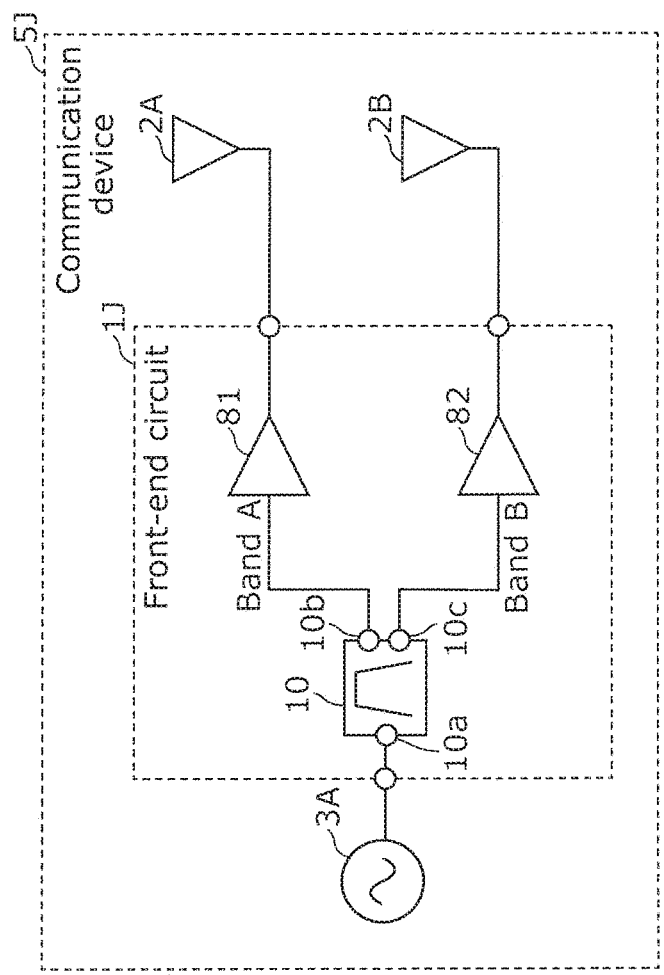
FIG. 15 is a circuit configuration diagram illustrating a front-end circuit and a communication device according to Variation 4 of Embodiment 1.

FIG. 15 is a circuit configuration diagram illustrating front-end circuit 1J and communication device 5J according to Variation 4 of Embodiment 1. Front-end circuit 1J illustrated in FIG. 15 is an example of a transmission circuit that transfers radio frequency signals generated by a signal generator such as an RFIC, and transmits the radio frequency signals from antennas 2A and 2B. In front-end circuit 1J and communication device 5J, power amplifiers 81 and 82 are disposed in place of low-noise amplifiers 21 and 22.

In other words, front-end circuit 1J has input terminal 10a and output terminals 10b and 10c, and includes: filter 10 that converts an unbalanced radio frequency signal inputted to input terminal 10a into two balanced radio frequency signals, and outputs one of the two balanced radio frequency signals from output terminal 10b and the other of the two balanced radio frequency signals from output terminal 10c; power amplifier 81 connected to output terminal 10b; and power amplifier 82 connected to output terminal 10c. Further, communication device 53 includes: signal generator 3A that processes radio frequency signals to be transmitted from antennas 2A and 2B; and front-end circuit 1J that transfers radio frequency signals between antennas 2A and 2B and signal generator 3A.

According to the above configurations of front-end circuit 13 and communication device 5J, one filter 10 having a band selection function and an unbalanced-to-balanced conversion function simultaneously transfers the first radio frequency signal in communication band A and the second radio frequency signal in communication band B. In consequence, it is possible to provide small front-end circuit 1J and small communication device 53 that simultaneously transfer radio frequency signals. Moreover, since radio frequency signals for which filter 10 has reduced unnecessary signals other than signals in the first passband and the second passband are inputted to power amplifiers 81 and 82, it is possible to reduce the distortion of amplified signals outputted from low-noise amplifiers 81 and 82.

It should be noted that front-end circuit 1J and communication device 53 can be used for transfer of a signal in a millimeter band greater than or equal to 7 GHz. In this case, it is desirable that filter 10 include a distributed constant resonance line.

The controller according to the present disclosure may be realized as an integrated circuit (IC) or large scale integration (LSI). Furthermore, the method of implementation of structural elements using an integrated circuit may be realized using a dedicated circuit or a general-purpose processor. A field programmable gate array (FPGA) that allows for programming after the manufacture of an LSI, or a reconfigurable processor that allows for reconfiguration of connection and the setting of circuit cells inside an LSI may be employed. When circuit integration technology that replaces LSIs comes along owning to advances of the semiconductor technology or to a separate derivative technology, the function blocks may understandably be integrated using that technology.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a front-end circuit and a communication device that simultaneously transfer radio frequency signals of at least two different communication systems.

The invention claimed is:

1. A front-end circuit, comprising:
a first filter comprising a first input terminal, a first output terminal, and a second output terminal, and configured to:
convert a first unbalanced radio frequency signal inputted to the first input terminal into first and second balanced radio frequency signals,
output the first balanced radio frequency signal from the first output terminal, and
output the second balanced radio frequency signal from the second output terminal;
a first low-noise amplifier that is connected to the first output terminal; and
a second low-noise amplifier that is connected to the second output terminal,
wherein the first and second balanced radio frequency signals are in antiphase.

2. The front-end circuit according to claim 1, wherein:
the first filter is configured to pass signals in a first passband between the first input terminal and the first output terminal, and to pass signals in a second passband between the first input terminal and the second output terminal,
the front-end circuit further comprises:
a third low-noise amplifier; and
a second filter that has a third passband that encompasses the first passband and the second passband,
the third low-noise amplifier has an output connected to the first input terminal, and
the third low-noise amplifier has an input connected to an output end of the second filter.

3. The front-end circuit according to claim 2, further comprising:
an antenna terminal that is connected to an antenna; and
a third filter that has a fourth passband that does not overlap the third passband,
wherein the second filter and the third filter each have an input connected to the antenna terminal.

4. The front-end circuit according to claim 3, further comprising:
a fourth low-noise amplifier;
a fourth filter comprising a second input terminal, a third output terminal, and a fourth output terminal, and configured to:
convert a second unbalanced radio frequency signal inputted to the second input terminal into third and fourth balanced radio frequency signals,
output the third balanced radio frequency signal from the third output terminal, and
output the fourth balanced radio frequency signal from the fourth output terminal;
a fifth low-noise amplifier that is connected to the third output terminal; and
a sixth low-noise amplifier that is connected to the fourth output terminal,
wherein a passband of the fourth filter does not overlap a passband of the first filter,
the fourth low-noise amplifier has an output connected to the second input terminal, and
the fourth low-noise amplifier has an input connected to an output of the third filter.

5. The front-end circuit according to claim 1, wherein:
the front-end circuit is configured to support a communication scheme in which different communication systems are used simultaneously,
the first filter is configured to pass signals in a first passband between the first input terminal and the first output terminal, and to pass signals in a second passband between the first input terminal and the second output terminal, and
the first passband and the second passband at least partially overlap.

6. The front-end circuit according to claim 5, wherein the first passband and the second passband have the same frequency range.

7. The front-end circuit according to claim 1, wherein:
the front-end circuit is configured to support a communication scheme in which a single communication system is used,
the first filter is configured to pass signals in a first passband between the first input terminal and the first output terminal, and to pass signals in a second passband between the first input terminal and the second output terminal, and
the first passband and the second passband are at least partially non-overlapping.

8. The front-end circuit according to claim 1, further comprising:
an impedance-tunable circuit that is connected to the first filter, the impedance-tunable circuit comprising:
an impedance element; and
a switch that is connected to the impedance element,
wherein the switch is configured to be selectively switched in accordance with a frequency band of the first unbalanced radio frequency signal transferred through the front-end circuit.

9. The front-end circuit according to claim 1, further comprising:
a fifth filter comprising a third input terminal and a fifth output terminal that are unbalanced, and having a fifth passband that does not overlap a passband of the first filter; and
a seventh low-noise amplifier that is connected to the fifth output terminal,
wherein the third input terminal is connected to the first input terminal.

10. The front-end circuit according to claim 1, further comprising:
a sixth filter comprising a fourth input terminal, a sixth output terminal, and a seventh output terminal, and configured to:
convert a third unbalanced radio frequency signal inputted to the fourth input terminal into fifth and sixth balanced radio frequency signals,
output the fifth balanced radio frequency signal from the sixth output terminal, and
output the sixth balanced radio frequency signal from the seventh output terminal;
an eighth low-noise amplifier that is connected to the sixth output terminal; and
a ninth low-noise amplifier that is connected to the seventh output terminal, wherein:
a passband of the sixth filter does not overlap a passband of the first filter, and
the fourth input terminal is connected to the first input terminal.

11. The front-end circuit according to claim 1, further comprising:
a seventh filter comprising a fifth input terminal and an eighth output terminal that are unbalanced, and having a sixth passband that does not overlap a passband of the first filter;

an eighth filter comprising the fifth input terminal and a ninth output terminal that is unbalanced, and having a seventh passband that does not overlap the passband of the first filter or the sixth passband;
a tenth low-noise amplifier that is connected to the eighth output terminal; and
an eleventh low-noise amplifier that is connected to the ninth output terminal,
wherein the fifth input terminal is connected to the first input terminal.

12. A communication device, comprising:
the front-end circuit according to claim 1; and
a radio frequency (RF) signal processing circuit configured to process the first unbalanced radio frequency signal transmitted or received by an antenna,
wherein the front-end circuit is configured to transfer the first unbalanced radio frequency signal between the antenna and the RF signal processing circuit.

13. A front-end circuit, comprising:
a first filter comprising a first input terminal, a first output terminal, and a second output terminal, and configured to:
convert a first unbalanced radio frequency signal inputted to the first input terminal into first and second balanced radio frequency signals,
output the first balanced radio frequency signal from the first output terminal, and
output the second balanced radio frequency signal from the second output terminal;
a first low-noise amplifier that is connected to the first output terminal; and
a second low-noise amplifier that is connected to the second output terminal,
wherein the first and second balanced radio frequency signals have at least partially overlapping frequency bands.

14. A front-end circuit, comprising:
a first filter comprising a first input terminal, a first output terminal, and a second output terminal, and configured to:
convert a first unbalanced radio frequency signal inputted to the first input terminal into first and second balanced radio frequency signals,
output the first balanced radio frequency signal from the first output terminal, and
output the second balanced radio frequency signal from the second output terminal;
a first power amplifier that is connected to the first output terminal; and
a second power amplifier that is connected to the second output terminal,
wherein the first and second balanced radio frequency signals are in antiphase.

* * * * *

UNITED STATES PATENT AND TRADEMARK OFFICE
CERTIFICATE OF CORRECTION

PATENT NO. : 11,177,780 B2  
APPLICATION NO. : 16/831107  
DATED : November 16, 2021  
INVENTOR(S) : Junichi Yoshioka et al.

Page 1 of 1

It is certified that error appears in the above-identified patent and that said Letters Patent is hereby corrected as shown below:

In the Specification

Column 23, Line 7, "53" should be – 5J –.

Column 23, Line 13, "13" should be – 1J –.

Column 23, Line 27, "53" should be – 5J –.

Signed and Sealed this  
Sixth Day of September, 2022

Katherine Kelly Vidal  
*Director of the United States Patent and Trademark Office*